US012804800B2

(12) United States Patent
Okuda

(10) Patent No.: US 12,804,800 B2
(45) Date of Patent: Nov. 17, 2026

(54) MULTILAYER SUBSTRATE AND METHOD FOR MANUFACTURING MULTILAYER SUBSTRATE

(71) Applicant: Murata Manufacturing Co., Ltd., Nagaokakyo (JP)

(72) Inventor: Noriaki Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 220 days.

(21) Appl. No.: 18/383,550

(22) Filed: Oct. 25, 2023

(65) Prior Publication Data

US 2024/0107662 A1 Mar. 28, 2024

Related U.S. Application Data

(63) Continuation of application No. PCT/JP2022/020235, filed on May 13, 2022.

(30) Foreign Application Priority Data

Jun. 16, 2021 (JP) ................................ 2021-099989

(51) Int. Cl.
*H05K 1/02* (2006.01)
*H05K 3/46* (2006.01)

(52) U.S. Cl.
CPC ......... *H05K 1/0237* (2013.01); *H05K 3/4644* (2013.01)

(58) Field of Classification Search
CPC .... H05K 1/0237; H05K 1/0278; H05K 1/028; H05K 1/0271; H05K 1/0298; H05K 1/0283; H05K 3/4644; H05K 3/4691; H05K 3/4694; H05K 3/4697; H05K 3/4673; B32B 3/30
See application file for complete search history.

(56) References Cited

FOREIGN PATENT DOCUMENTS

| | | | |
|---|---|---|---|
| CN | 105530769 | A | 4/2016 |
| EP | 0534733 | A1 | 3/1993 |
| JP | 5553492 | A | 4/1980 |
| JP | 05238849 | A | 9/1993 |
| JP | 07202439 | A | 8/1995 |

(Continued)

OTHER PUBLICATIONS

Translation of CN105530769A. (Year: 2016).*

(Continued)

*Primary Examiner* — Catherine A. Simone
(74) *Attorney, Agent, or Firm* — Keating & Bennett, LLP

(57) ABSTRACT

A multilayer substrate includes a multilayer body including first insulator layers and a second insulator layer stacked on each other. The multilayer body includes first and second regions when viewed in a stacking direction. The first region is a region that does not include the second insulator layer when viewed in the stacking direction. The second region is a region that includes the second insulator layer when viewed in the stacking direction. The first insulator layers include a small-area first insulator layer located in the first region and not located in the second region. The small-area first insulator layer overlaps the second insulator layer when viewed in a first direction. A porosity of the second insulator layer is higher than an overall porosity of the first insulator layers.

13 Claims, 29 Drawing Sheets

(56) References Cited

FOREIGN PATENT DOCUMENTS

| | | | |
|---|---|---|---|
| JP | 2011071442 | A | 4/2011 |
| JP | 2016164882 | A | 9/2016 |
| JP | 2020080386 | A | 5/2020 |

OTHER PUBLICATIONS

International Search Report in PCT/JP2022/020235, mailed Jul. 26, 2022, 3 pages.

Written Opinion in PCT/JP2022/020235, mailed Jul. 26, 2022, 5 pages.

* cited by examiner

MULTILAYER SUBSTRATE AND METHOD FOR MANUFACTURING MULTILAYER SUBSTRATE

CROSS REFERENCE TO RELATED APPLICATIONS

This application claims the benefit of priority to Japanese Patent Application No. 2021-099989 filed on Jun. 16, 2021 and is a Continuation Application of PCT Application No. PCT/JP2022/020235 filed on May 13, 2022. The entire contents of each application are hereby incorporated herein by reference.

BACKGROUND OF THE INVENTION

1. Field of the Invention

The present invention relates to a multilayer substrate and a method for manufacturing the multilayer substrate.

2. Description of the Related Art

As an invention related to an existing multilayer substrate, for example, a high-frequency multilayer circuit board described in Japanese Unexamined Patent Application Publication No. 7-202439 has been known. This high-frequency multilayer circuit board includes two layers of prepreg and one layer of thermoplastic resin foam film. The one layer of thermoplastic resin foam film is located between the two layers of prepreg. The thermoplastic resin foam film has a low dielectric constant. Therefore, a dielectric constant of the high-frequency multilayer circuit board is lowered. As a result, dielectric loss of the high-frequency multilayer circuit board is reduced.

SUMMARY OF THE INVENTION

Incidentally, in the high-frequency multilayer circuit board described in Japanese Unexamined Patent Application Publication No. 7-202439, when the two layers of prepreg and the one layer of thermoplastic resin foam film are hot-pressed, voids of the thermoplastic resin foam film are easily crushed.

Preferred embodiments of the present invention provide multilayer substrates and methods for manufacturing multilayer substrates each capable of reducing or preventing crushing of voids of a second insulator layer.

A multilayer substrate according to a preferred embodiment of the present invention includes a multilayer body including a plurality of first insulator layers and a second insulator layer stacked on each other, wherein a direction orthogonal to a stacking direction of the multilayer body is a first direction, a direction orthogonal to the stacking direction and the first direction is a second direction, the multilayer body includes a first region and a second region when viewed in the stacking direction, the first region is a region that does not include the second insulator layer when viewed in the stacking direction, the second region is a region that includes the second insulator layer when viewed in the stacking direction, the plurality of first insulator layers includes a small-area first insulator layer, the first region and the second region are adjacent to each other in the second direction when viewed in the stacking direction, the small-area first insulator layer is located in the first region and is not located in the second region, the small-area first insulator layer overlaps the second insulator layer when viewed in the first direction, a porosity of the second insulator layer is higher than a porosity of the plurality of first insulator layers, and a thickness in the stacking direction of the second insulator layer is smaller than a thickness in the stacking direction of the small-area first insulator layer overlapping the second insulator layer when viewed in the first direction.

A method for manufacturing a multilayer substrate according to a preferred embodiment of the present invention includes preparing a plurality of first insulator layers including a small-area first insulator layer and one or more large-area first insulator layers, an area of a main surface of the small-area first insulator layer being smaller than an area of a main surface of the large-area first insulator layer, preparing a second insulator layer, a porosity of the second insulator layer being higher than an overall porosity of the plurality of first insulator layers, stacking the small-area first insulator layer, the large-area first insulator layer, and the second insulator layer to form a multilayer body, in which a direction orthogonal to a stacking direction of the multilayer body is a first direction, the small-area first insulator layer overlaps the second insulator layer when viewed in the first direction, and the small-area first insulator layer and the second insulator layer overlap the large-area first insulator layer in the stacking direction, and applying a pressure treatment to the multilayer body after the stacking, wherein a thickness in the stacking direction of the second insulator layer is smaller than a thickness in the stacking direction of the small-area first insulator layer overlapping the second insulator layer when viewed in the first direction.

According to the multilayer substrates and the methods for manufacturing multilayer substrates of preferred embodiments of the present invention, it is possible to reduce or prevent crushing of the voids of the second insulator layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment

Structure of Circuit Board

Figure 1:
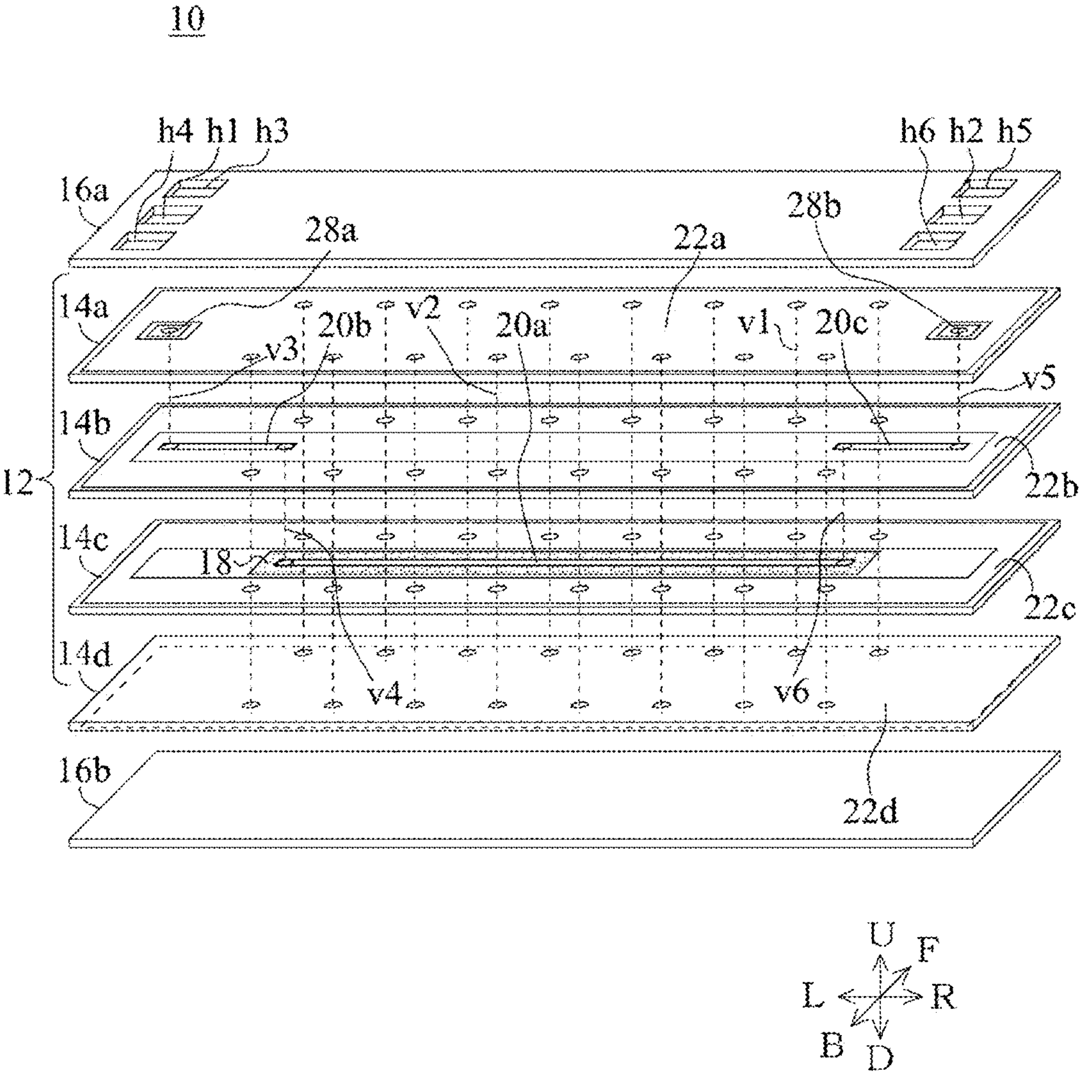
FIG. 1 is an exploded perspective view of a multilayer substrate 10.
Figure 2:
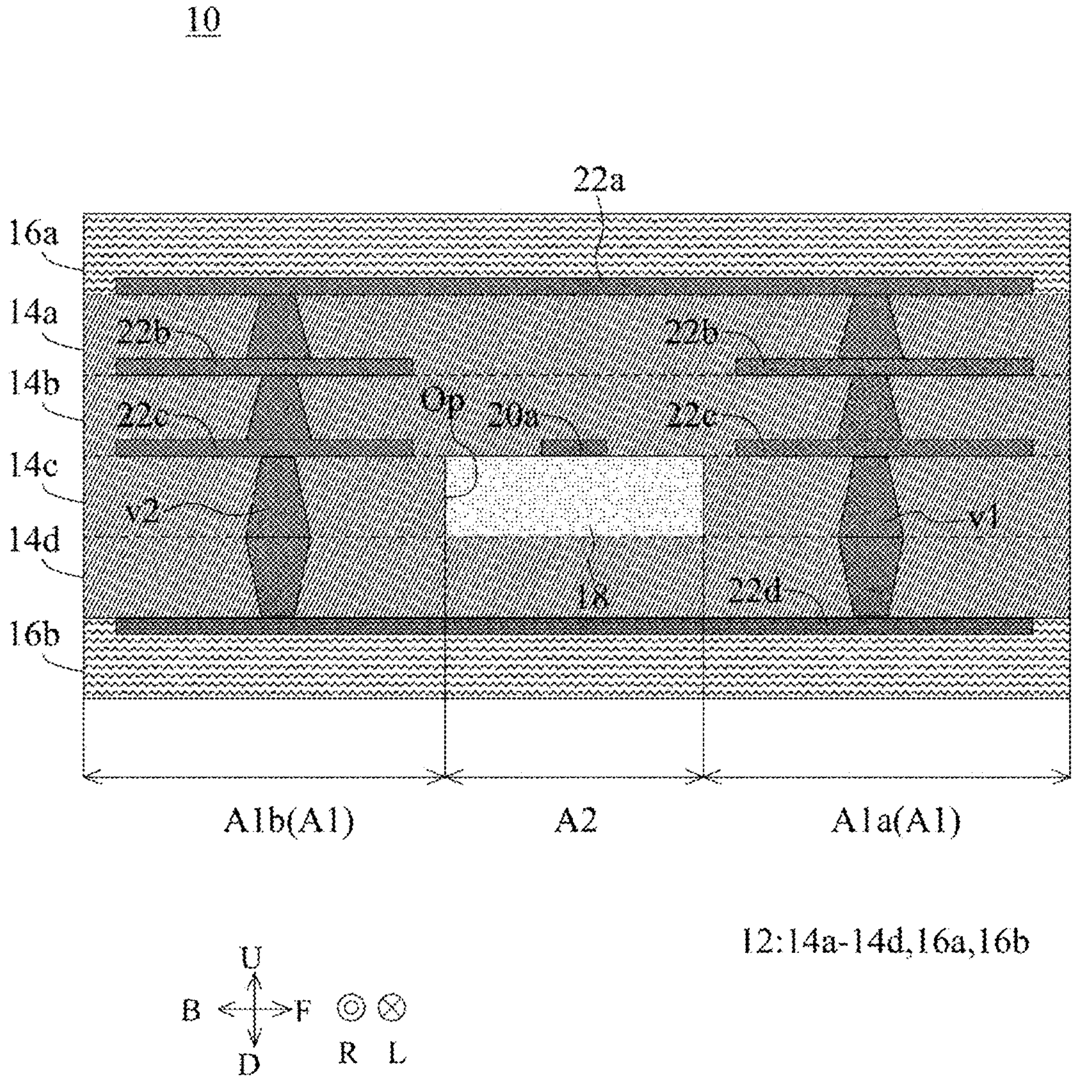
FIG. 2 is a cross-sectional view orthogonal to a left-right direction of the multilayer substrate 10.
Figure 3:
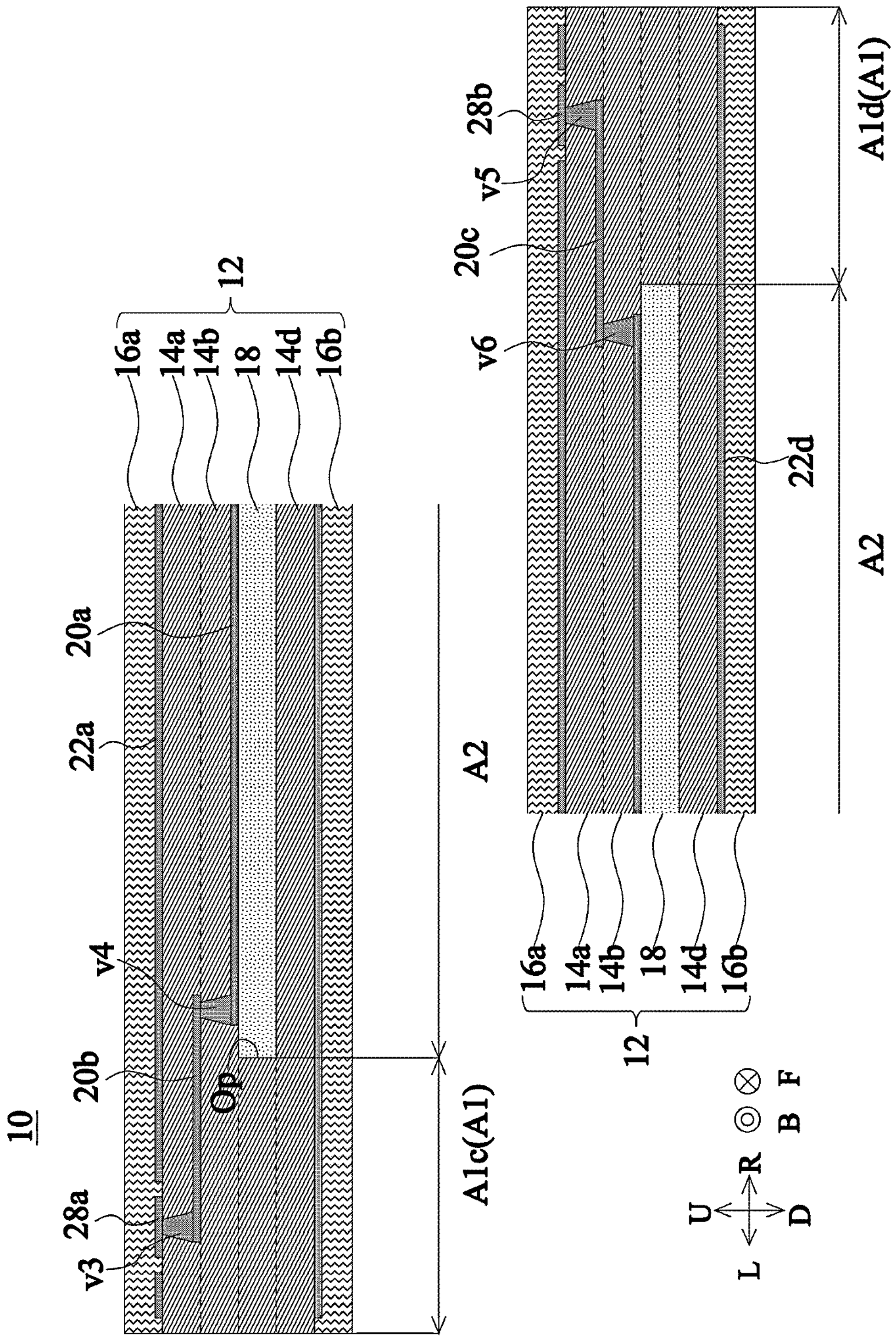
FIG. 3 is a cross-sectional view orthogonal to a front-back direction of the multilayer substrate 10.

Hereinafter, a structure of a multilayer substrate 10 according to a preferred embodiment of the present invention will be described with reference to the drawings. FIG. 1 is an exploded perspective view of the multilayer substrate 10. Note that in FIG. 1, only a representative interlayer connection conductor v1 and a representative interlayer connection conductor v2 among a plurality of interlayer connection conductors v1 and a plurality of interlayer connection v2 are denoted by reference numerals. FIG. 2 is a cross-sectional view orthogonal to a left-right direction of the multilayer substrate 10. FIG. 3 is a cross-sectional view orthogonal to a front-back direction of the multilayer substrate 10.

In this specification, directions are defined as follows. An up-down direction is a stacking direction of a multilayer body 12. The front-back direction is a first direction in which a first region front portion A1*a*, a second region A2, and a first region rear portion A1*b* are arranged. The first direction is orthogonal to the stacking direction of the multilayer body 12. The left-right direction is a second direction in which a first region left portion A1*c*, the second region A2, and a first region right portion A1*d* are arranged. The second direction is a direction orthogonal to the stacking direction and the first direction. Note that the up-down direction, the front-back direction, and the left-right direction in the present preferred embodiment need not coincide with the up-down direction, the front-back direction, and the left-right direction when the multilayer substrate 10 is used.

In the following, X and Y are components or members of the multilayer substrate 10. In this specification, unless otherwise specified, each portion of X is defined as follows. A front portion of X means a front half of X. A rear portion of X means a rear half of X. A left portion of X means a left half of X. A right portion of X means a right half of X. An upper portion of X means an upper half of X. A lower portion of X means a lower half of X. A front end of X means an end in a front direction of X. A rear end of X means an end in a rear direction of X. A left end of X means an end in a left direction of X. A right end of X means an end in a right direction of X. An upper end of X means an end in an upward direction of X. A lower end of X means an end in a downward direction of X. A front end portion of X means the front end of X and its vicinity. A rear end portion of X means the rear end of X and its vicinity. A left end portion of X means the left end of X and its vicinity. A right end portion of X means the right end of X and its vicinity. An upper end portion of X means the upper end of X and its vicinity. A lower end portion of X means the lower end of X and its vicinity.

In addition, "X is located over Y" means that X is located directly over Y. Therefore, when viewed in the up-down direction, X overlaps Y. "X is located above Y" means that X is located directly above Y and that X is located obliquely above Y. Therefore, when viewed in the up-down direction, X may overlap Y or need not overlap Y. This definition also applies to directions other than upward.

First, the structure of the multilayer substrate 10 will be described with reference to FIG. 1. The multilayer substrate 10 transmits a high-frequency signal. The multilayer substrate 10 is used to electrically connect two circuits in an electronic device such as a smartphone. As illustrated in FIG. 1, the multilayer substrate 10 includes the multilayer body 12, protective layers 16*a* and 16*b*, signal conductor layers 20*a* to 20*c* (first signal conductor layers), reference conductor layers 22*a* to 22*d*, signal electrode layers 28*a* and 28*b*, the plurality of interlayer connection conductors v1, the plurality of interlayer connection conductors v2, and interlayer connection conductors v3 to v6.

The multilayer body 12 has a structure in which a plurality of insulator layers is stacked. The plurality of insulator layers includes first insulator layers 14*a* to 14*d* and a second insulator layer 18. The first insulator layers 14*a* to 14*d* and the second insulator layer 18 are dielectric layers. The first insulator layers 14*a* to 14*d* are stacked so as to be arranged in this order from top to bottom. Outer edges of the first insulator layers 14*a* to 14*d* each have the same shape when viewed in the up-down direction. The outer edges of the first insulator layers 14*a* to 14*d* each have a rectangular shape when viewed in the up-down direction. The long sides of the first insulator layers 14*a* to 14*d* extend in the left-right direction. The short sides of the first insulator layers 14*a* to 14*d* extend in the front-back direction.

In addition, as illustrated in FIG. 2 and FIG. 3, an opening Op is provided in the first insulator layer 14*c*. The opening Op is an insulator layer non-forming region in which the first insulator layer 14*c* is not provided. In addition, the opening Op overlaps the first insulator layers 14*a*, 14*b*, and 14*d* when viewed in the up-down direction. The opening Op has a rectangular shape when viewed in the up-down direction. The opening Op extends in the left-right direction near the center of the first insulator layer 14*c* in the front-back direction when viewed in the up-down direction. However, the left end of the opening Op is located to the left of the right end of the first insulator layer 14*c*. The right end of the opening Op is located to the left of the right end of the first insulator layer 14*c*.

As described above, when viewed in the up-down direction, an area of the first insulator layer 14*c* is smaller than areas of the first insulator layers 14*a*, 14*b*, and 14*d*. Therefore, the first insulator layers 14*a* to 14*d* include the first insulator layer 14*c* which is a small-area first insulator layer and the first insulator layers 14*a*, 14*b*, and 14*d* which are large-area first insulator layers.

The material of the first insulator layers 14*a* to 14*d* is a thermoplastic resin. The thermoplastic resin is a thermoplastic resin such as a liquid crystal polymer or polytetrafluoroethylene (PTFE). The material of the first insulator layers 14*a* to 14*d* may be polyimide.

The protective layer 16*a* is located over the first insulator layer 14*a*. The protective layer 16*a* is a protective layer that protects the reference conductor layer 22*a* described later. The protective layer 16*b* is located under the first insulator layer 14*d*. The protective layer 16*b* is a protective layer that protects the reference conductor layer 22*d* described later. The protective layers 16*a* and 16*b* are resist layers or coverlay layers. The protective layers 16*a* and 16*b* may be formed by applying an insulating material, or may be formed by attaching a sheet. The protective layers 16*a* and 16*b* described above are not part of the multilayer body 12. The protective layers 16*a* and 16*b* are layers that protect the conductor layers provided on an upper main surface or a lower main surface of the multilayer body 12. Therefore, the material of the protective layers 16*a* and 16*b* is different from the material of the first insulator layers 14*a* to 14*d* and the material of the second insulator layer 18.

The second insulator layer 18 is provided in the opening Op. Therefore, the second insulator layer 18 is surrounded by the first insulator layer 14*c* when viewed in the up-down direction. In addition, the second insulator layer 18 is located between the first insulator layer 14*b* and the first insulator layer 14*d*. The material of the second insulator layer 18 is a thermoplastic resin. The thermoplastic resin is a thermoplastic resin such as a liquid crystal polymer or polytetrafluoroethylene (PTFE). The material of the second insulator layer 18 may be polyimide. However, a porosity of the second insulator layer 18 is higher than a porosity of the first insulator layers 14*a* to 14*d*. That is, the second insulator layer 18 has a porous structure. The porous structure is a structure in which a plurality of air bubbles is dispersed throughout the second insulator layer 18. In the present preferred embodiment, the second insulator layer 18 includes air bubbles. In other words, air bubbles are included in the second insulator layer 18. More specifically, the second insulator layer 18 includes a plurality of closed cells. The closed cell has a structure in which the entire air bubble is surrounded by the material of the second insulator layer 18 so that the gas in the air bubble cannot leak to the outside of the second insulator layer 18. Further, in the closed cells, adjacent air bubbles are not connected to each other.

The porosity is measured, for example, by measuring the porosity based on an image of a cross section of the insulator layer, or by immersing a multilayer body having a cross section to be measured in a fluorescent liquid and then measuring the porosity by an optical method. When the measurement is performed by the former method, the measurement is performed at a magnification of at least 1000 times or more (so that an interface or a void can be seen). Note that when the cross section is cut out, rotating speed of a polishing machine is lowered to at least equal to or less than 120 rpm so that the voids are not crushed. In addition, abrasive paper having a grain size of 240 (JIS R 6010) or more is used. A plurality of cross sections is measured and an average value thereof is adopted.

No interlayer connection conductor is located in such the second insulator layer 18.

Note that in the measurement of the porosity, the interface between the insulator layers is avoided. Specifically, first, the region is divided into four equal parts from a boundary of the second insulator layer, and a length of at least one fourth of each side in the region of the central two equal parts is set as a measurement region. Next, in a thickness direction of the first insulator layer, a measurement region is set in the same manner as the second insulator layer, and in a horizontal direction (width, depth), the second insulator layer is used as the standard. At this time, measurement is performed while avoiding a via and an (adjacent) conductor pattern. For example, the difference between a first porosity and a second porosity is equal to or more than about 30%, for example.

Here, as illustrated in FIG. 2 and FIG. 3, the multilayer body 12 includes a first region A1 and the second region A2 when viewed in the up-down direction (stacking direction). The second region A2 is a region including the second insulator layer 18 when viewed in the up-down direction. The first region A1 is a region excluding the second region A2 in the multilayer body 12. That is, the first region A1 is a region that does not include the second insulator layer 18 when viewed in the up-down direction. The first region A1 has a structure in which the first insulator layers 14*a* to 14*d* are stacked. The second region A2 has a structure in which the first insulator layers 14*a*, 14*b*, and 14*d* and the second insulator layer 18 are stacked. Thus, the first insulator layer 14*c*, which is the small-area first insulator layer, is located in the first region A1 and is not located in the second region A2. The first insulator layers 14*a*, 14*b*, and 14*d* which are the large-area first insulator layers are located in the first region A1 and the second region A2. The first insulator layers 14*a*, 14*b*, and 14*d*, which are the large-area first insulator layers, are located in at least a portion of the first region A1 and the entire second region A2 when viewed in the up-down direction (stacking direction), and are located at a boundary between the first region A1 and the second region A2 when viewed in the up-down direction (stacking direction). The second insulator layer 18 is not located in the first region A1 and is located in the second region A2.

Hereinafter, a portion in the first region A1 located in front of the second region A2 is referred to as the first region front portion A1*a*. A portion in the first region A1 located behind the second region A2 is referred to as the first region rear portion A1*b*. A portion in the first region A1 located on the left of the second region A2 is referred to as the first region left portion A1*c*. A portion in the first region A1 located to the right of the second region A2 is referred to as the first region right portion A1*d*. As illustrated in FIG. 2, the first region front portion A1*a* (first region) and the second region A2 are adjacent to each other in the front-back direction (first direction) when viewed in the up-down direction (stacking direction). As illustrated in FIG. 2, the first region rear portion A1*b* (first region) and the second region A2 are adjacent to each other in the front-back direction (first direction) when viewed in the up-down direction (stacking direction). As illustrated in FIG. 3, the first region left portion A1*c* (first region) and the second region A2 are adjacent to each other in the left-right direction (second direction) when viewed in the up-down direction (stacking direction). As illustrated in FIG. 3, the first region right portion A1*d* (first region) and the second region A2 are adjacent to each other in the left-right direction (second direction) when viewed in the up-down direction (stacking direction).

As illustrated in FIG. 1 and FIG. 2, the first insulator layer 14*c*, which is a small-area first insulator layer, overlaps the second insulator layer 18 when viewed in the front-back direction (first direction). That is, the first insulator layer 14*c* is arranged with the second insulator layer 18 in the front-back direction. As described above, the first insulator layer 14*c* is not located in the second region A2. The second insulator layer 18 is not located in the first region A1. Thus, a side surface of the first insulator layer 14*c* and a side surface of the second insulator layer 18 face each other. In the present preferred embodiment, the side surface of the first insulator layer 14*c* and the side surface of the second insulator layer 18 are in contact with each other. In addition, as illustrated in FIG. 1 and FIG. 3, the first insulator layer 14*c*, which is a small-area first insulator layer, overlaps the second insulator layer 18 when viewed in the left-right direction (second direction). Thus, the side surface of the first insulator layer 14*c* and the side surface of the second insulator layer 18 face each other. In the present preferred embodiment, the side surface of the first insulator layer 14*c* and the side surface of the second insulator layer 18 are in contact with each other.

As illustrated in FIG. 1, the signal conductor layer 20*a* is provided in the multilayer body 12. The signal conductor layer 20*a* is provided on an upper main surface of the second insulator layer 18. The signal conductor layer 20*a* extends in the left-right direction. The signal conductor layer 20*a* has a linear shape. The left end of the signal conductor layer 20*a* is located to the right of the left end of the second insulator layer 18. The right end of the signal conductor layer 20*a* is located to the left of the right end of the second insulator layer 18. Thus, the signal conductor layer 20*a* (first signal conductor layer) is located in the second region A2, and is sandwiched in the second insulator layer 18 in the front-back direction (first direction) and the left-right direction (second direction) when viewed in the up-down direction (stacking direction).

As illustrated in FIG. 1, the signal conductor layers 20*b* and 20*c* are provided in the multilayer body 12. The signal conductor layers 20*b* and 20*c* are provided on an upper main surface of the first insulator layer 14*b*. The signal conductor layers 20*b* and 20*c* extend in the left-right direction. The signal conductor layers 20*b* and 20*c* have a linear shape. The right end portion of the signal conductor layer 20*b* overlaps the left end portion of the signal conductor layer 20*a* when viewed in the up-down direction. The left end portion of the signal conductor layer 20*b* is located at the left end portion of the first insulator layer 14*b*. The left end portion of the signal conductor layer 20*c* overlaps the right end portion of the signal conductor layer 20*a* when viewed in the up-down direction. The right end portion of the signal conductor layer 20*c* is located at the right end portion of the first insulator layer 14*b*.

At least a portion of each of the signal conductor layers 20*a* to 20*c* as described above is located in the second region A2. In the present preferred embodiment, as illustrated in FIG. 3, the entire signal conductor layer 20*a*, the right end portion of the signal conductor layer 20*b*, and the left end portion of the signal conductor layer 20*c* are located in the second region A2. A high-frequency signal is transmitted through such the signal conductor layers 20*a* to 20*c*.

The signal electrode layer 28*a* is provided on an upper main surface of the first insulator layer 14*a*. The signal electrode layer 28*a* has a rectangular shape when viewed in the up-down direction. The signal electrode layer 28*a* overlaps the left end portion of the signal conductor layer 20*b* when viewed in the up-down direction.

The interlayer connection conductor v3 is provided in the multilayer body 12. The interlayer connection conductor v3 passes through the first insulator layer 14*a* in the up-down direction. The interlayer connection conductor v3 electrically connects the signal electrode layer 28*a* and the left end portion of the signal conductor layer 20*b*. The interlayer connection conductor v4 is provided in the multilayer body 12. The interlayer connection conductor v4 passes through the first insulator layer 14*b* in the up-down direction. The interlayer connection conductor v4 electrically connects the right end portion of the signal conductor layer 20*b* and the left end portion of the signal conductor layer 20*a*.

Since the signal electrode layer 28*b* and the interlayer connection conductors v5 and v6 have structures that are bilaterally symmetrical to the signal electrode layer 28*a* and the interlayer connection conductors v3 and v4, description thereof is omitted. A high-frequency signal is input to and output from the signal electrode layers 28*a* and 28*b*.

The reference conductor layer 22*a* is provided on the upper main surface of the first insulator layer 14*a*. The reference conductor layer 22*a* covers substantially the entire upper main surface of the first insulator layer 14*a*. However, the reference conductor layer 22*a* is not in contact with the signal electrode layers 28*a* and 28*b*. The reference conductor layer 22*b* is provided on the upper main surface of the first insulator layer 14*b*. However, the reference conductor layer 22*b* is not in contact with the signal conductor layers 20*b* and 20*c*. In addition, the reference conductor layer 22*b* does not overlap the signal conductor layer 20*a* when viewed in the up-down direction. The reference conductor layer 22*c* is provided on an upper main surface of the first insulator layer 14*c*. However, the reference conductor layer 22*c* is not in contact with the signal conductor layer 20*a*. The reference conductor layer 22*d* is provided on a lower main surface of the first insulator layer 14*d*. The reference conductor layer 22*d* covers substantially the entire lower main surface of the first insulator layer 14*d*. As described above, the reference conductor layer 22*a* is located above the signal conductor layers 20*a* to 20*c*. The reference conductor layer 22*d* is located below the signal conductor layers 20*a* to 20*c*. As a result, the signal conductor layers 20*a* to 20*c* and the reference conductor layers 22*a* and 22*d* define a strip line structure.

The signal conductor layers 20*a* to 20*c*, the reference conductor layers 22*a* to 22*d*, and the signal electrode layers 28*a* and 28*b* are formed by patterning on metal foils attached to the upper main surfaces of the first insulator layers 14*a* to 14*c* and an upper main surface of the first insulator layer 14*d* or the lower main surface of the first insulator layer 14*d* and lower main surfaces of the first insulator layers 14*a* to 14*c*. The metal foil is, for example, a copper foil.

The plurality of interlayer connection conductors v1 is provided in the multilayer body 12. The plurality of interlayer connection conductors v1 passes through the first insulator layers 14*a* to 14*d* in the up-down direction. The plurality of interlayer connection conductors v1 electrically connects the reference conductor layers 22*a* to 22*d*. The plurality of interlayer connection conductors v1 is located in front of the signal conductor layers 20*a* to 20*c*. The plurality of interlayer connection conductors v1 is arranged in a row in the left-right direction.

The plurality of interlayer connection conductors v2 is provided in the multilayer body 12. The plurality of interlayer connection conductors v2 passes through the first insulator layers 14*a* to 14*d* in the up-down direction. The plurality of interlayer connection conductors v2 electrically connects the reference conductor layers 22*a* to 22*d*. The plurality of interlayer connection conductors v2 is located behind the signal conductor layers 20*a* to 20*c*. The plurality of interlayer connection conductors v2 is arranged in a row in the left-right direction.

The plurality of interlayer connection conductors v1, the plurality of interlayer connection conductors v2, and the interlayer connection conductors v3 to v6 are via-hole conductors. The via-hole conductors are formed by filling through-holes passing through the first insulator layers 14*a* to 14*d* in the up-down direction with a conductive paste and solidifying the conductive paste by heating. Note that the plurality of interlayer connection conductors v1, the plurality of interlayer connection conductors v2, and the interlayer connection conductors v3 to v6 may be through-hole conductors. The through-hole conductors are formed by plating inner peripheral surfaces of through-holes passing through the first insulator layers 14*a* to 14*d* in the up-down direction.

The protective layer 16*a* is provided with openings h1 to h6. The openings h1, h3, and h4 are located at the left end portion of the protective layer 16*a*. The opening h3, the opening h1, and the opening h4 are arranged in this order from the front to the rear. The signal electrode layer 28*a* is exposed to the outside of the multilayer body 12 through the opening h1. A portion of the reference conductor layer 22*a* is exposed to the outside of the multilayer body 12 through the openings h3 and h4. The portion of the reference conductor layer 22*a* functions as an electrode layer to which a reference potential is connected. Since the structures of the openings h2, h5, and h6 are bilaterally symmetrical to those of the openings h1, h3, and h4, description thereof will be omitted.

Figure 4:
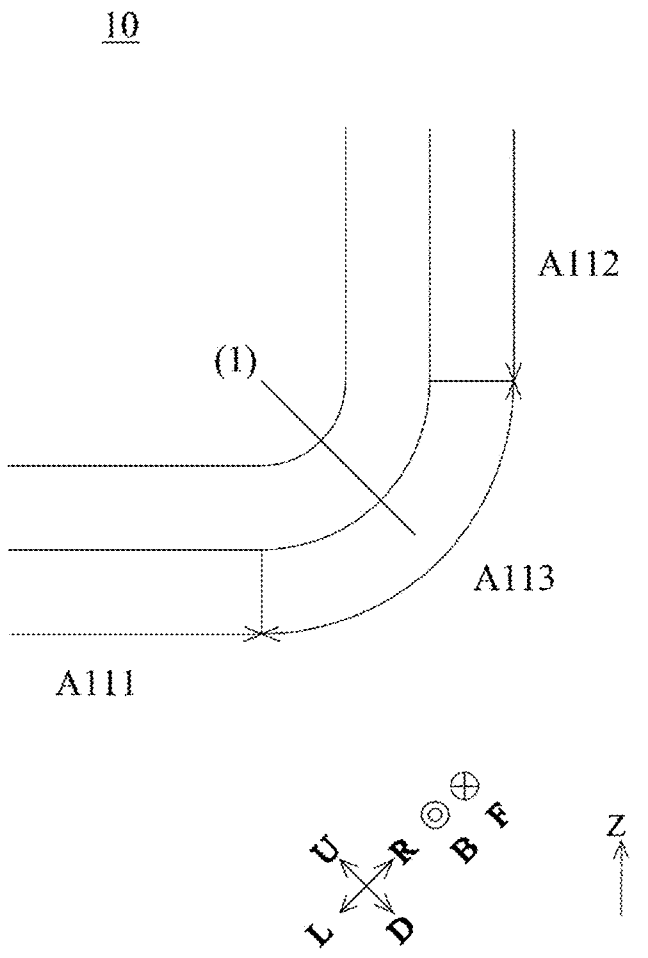
FIG. 4 is a rear view of a folded multilayer substrate 10.

The multilayer substrate 10 described above is used in a folded state. FIG. 4 is a rear view of a folded multilayer substrate 10.

In this specification, "the multilayer substrate 10 is bent" means that the multilayer substrate 10 is deformed and bent by receiving an external force. The deformation may be plastic deformation or elastic deformation. Further, the deformation may be plastic deformation and elastic deformation. The multilayer substrate 10 includes small deformation regions A111 and A112 and a large deformation region A113. The small deformation regions A111 and A112 are not bent. Therefore, the up-down direction in the small deformation region A111 is defined as a Z-axis direction. The Z-axis direction does not coincide with, for example, the up-down direction at a position (1). The large deformation region A113 is bent in the Z-axis direction relative to the small deformation region A111. In addition, the large deformation region A113 is a portion of the second region A2. Thus, the second region A2 is bent. On the other hand, the first region left portion A1*c* and the first region right portion A1*d* are not bent. As a result, a radius of curvature of the second region A2 is smaller than a radius of curvature of the first region A1.

Method for Manufacturing Multilayer Substrate 10

Next, a non-limiting example of a method for manufacturing the multilayer substrate 10 will be described with reference to FIG. 1.

First, the plurality of first insulator layers 14*a* to 14*d* is prepared (first preparation step). The plurality of first insulator layers 14*a* to 14*d* includes the first insulator layer 14*c* which is a small-area first insulator layer and the first insulator layers 14*a*, 14*b*, and 14*d* which are large-area first insulator layers. An area of the upper main surface (main surface) of the first insulator layer 14*c* which is the small-area insulator layer is smaller than an area of the upper main surface (main surface) of each of the first insulator layers 14*a*, 14*b*, and 14*d* which are the large-area first insulator layers. Therefore, the opening Op is formed in the first insulator layer 14*c*. The opening Op is formed by punching, laser beam irradiation, or the like.

Next, the second insulator layer 18 is prepared (second preparation step). The porosity of the second insulator layer 18 is higher than the overall porosity of the first insulator layers 14*a* to 14*d*.

Next, the signal conductor layers 20*a* to 20*c*, the reference conductor layers 22*a* to 22*d*, and the signal electrode layers 28*a* and 28*b* are formed. To be specific, a copper foil is attached to the upper main surface or the lower main surface of each of the first insulator layers 14*a* to 14*d*. Then, the signal conductor layers 20*a* to 20*c*, the reference conductor layers 22*a* to 22*d*, and the signal electrode layers 28*a* and 28*b* are formed by patterning the copper foil.

Next, the plurality of interlayer connection conductors v1, the plurality of interlayer connection conductors v2, and the interlayer connection conductors v3 to v6 are formed. To be specific, the first insulator layers 14*a* to 14*d* are irradiated with a laser beam to form a through-hole. Then, the through-hole is filled with a conductive paste.

After the first preparation step and the second preparation step, the first insulator layer 14*c* which is the small-area first insulator layer, the first insulator layers 14*a*, 14*b*, and 14*d* which are the large-area first insulator layers, and the second insulator layer 18 are stacked to form the multilayer body 12 (stacking step). At this time, the first insulator layer 14*c*, which is the small-area first insulator layer, overlaps the second insulator layer 18 when viewed in the front-back direction (first direction). Furthermore, the first insulator layer 14*c* which is the small-area first insulator layer and the second insulator layer 18 overlap the first insulator layers 14*a*, 14*b*, and 14*d* which are large-area first insulator layers when viewed in the up-down direction (stacking direction).

After the stacking step, a pressure treatment is applied to the multilayer body 12 (pressurizing step). Specifically, a heat treatment and the pressure treatment are applied to the multilayer body 12. Thus, the first insulator layers 14*a* to 14*d* soften and melt. Then, the first insulator layers 14*a* to 14*d* flow into gaps present in the multilayer body 12. The gaps are present, for example, between two adjacent first insulator layers 14*a* to 14*d*, between the first insulator layer 14*c* and the second insulator layer 18, and the like. When the multilayer body 12 is cooled, the first insulator layers 14*a* to 14*d* and the second insulator layer 18 are bonded to each other. Through the above steps, the multilayer substrate 10 is completed.

Note that after the pressurizing step, the second region A2 may be bent so that the radius of curvature of the second region A2 is smaller than the radius of curvature of the first region A1 (bending step). Here, when viewed in the up-down direction (stacking direction), the first region A1 and the second region A2 are arranged in the front-back direction (first direction). In the bending step, a portion in which the first region A1 and the second region A2 are arranged in the front-back direction (first direction) when viewed in the up-down direction (stacking direction) is bent.

Effects

According to the multilayer substrate 10, it is possible to reduce or prevent crushing of the voids of the second insulator layer 18. More specifically, the porosity of the second insulator layer 18 is higher than the porosity of the first insulator layer 14*c*. Therefore, the first insulator layer 14*c* is harder than the second insulator layer 18. The first insulator layer 14c overlaps the second insulator layer 18 when viewed in the front-back direction. As such, the first insulator layer 14c functions as a stopper when the multilayer body 12 is pressure-bonded, and the second insulator layer 18 is prevented from being crushed in the up-down direction by the first insulator layer 14c. As a result, the voids of the second insulator layer 18 are reduced or prevented from being crushed when the multilayer body 12 is pressure-bonded.

According to the multilayer substrate 10, loss of the high-frequency signals transmitted through the signal conductor layers 20a to 20c is reduced or prevented. More specifically, the multilayer body 12 includes the second insulator layer 18. Since the porosity of the second insulator layer 18 is high, a dielectric constant of the second insulator layer 18 is low. Thus, a dielectric constant in the vicinity of the signal conductor layers 20a to 20c is reduced. As a result, the loss of the high-frequency signals transmitted through the signal conductor layers 20a to 20c is reduced or prevented. In particular, in the multilayer substrate 10, at least a portion of each of the signal conductor layers 20a to 20c is located in the second region A2. Thus, the signal conductor layers 20a to 20c are located close to the second insulator layer 18. As a result, the dielectric constant in the vicinity of the signal conductor layers 20a to 20c is further reduced. As described above, according to the multilayer substrate 10, the loss of the high-frequency signals transmitted through the signal conductor layers 20a to 20c is further reduced or prevented.

According to the multilayer substrate 10, the occurrence of a short circuit in the interlayer connection conductor is reduced or prevented. More specifically, the porosity of the second insulator layer 18 is higher than the overall porosity of the first insulator layers 14a to 14d. Therefore, when the interlayer connection conductor is formed in the second insulator layer 18, the conductive paste is likely to bleed. Such bleeding of the conductive paste causes a short circuit of the interlayer connection conductor. Thus, no interlayer connection conductor is located in the second insulator layer 18. As such, occurrence of a short circuit in the interlayer connection conductor is reduced or prevented.

According to the multilayer substrate 10, the multilayer substrate 10 can be easily bent. More specifically, the porosity of the second insulator layer 18 is higher than the overall porosity of the first insulator layers 14a to 14d. Therefore, the second insulator layer 18 is easily deformed. The second insulator layer 18 like this is located in the second region A2. Thus, the second region A2 is bent. As such, according to the multilayer substrate 10, the multilayer substrate 10 can be easily bent.

According to the multilayer substrate 10, the second region A2 is bent in the Z-axis direction. However, the first region A1 and the second region A2 are arranged in the front-back direction. Therefore, when the second region A2 is bent, the first insulator layer 14c functions as a spacer. Thus, the first insulator layer 14c prevents a large force from being applied to the second insulator layer 18. As a result, the crushing of the voids of the second insulator layer 18 is reduced or prevented.

First Modification

Figure 5:
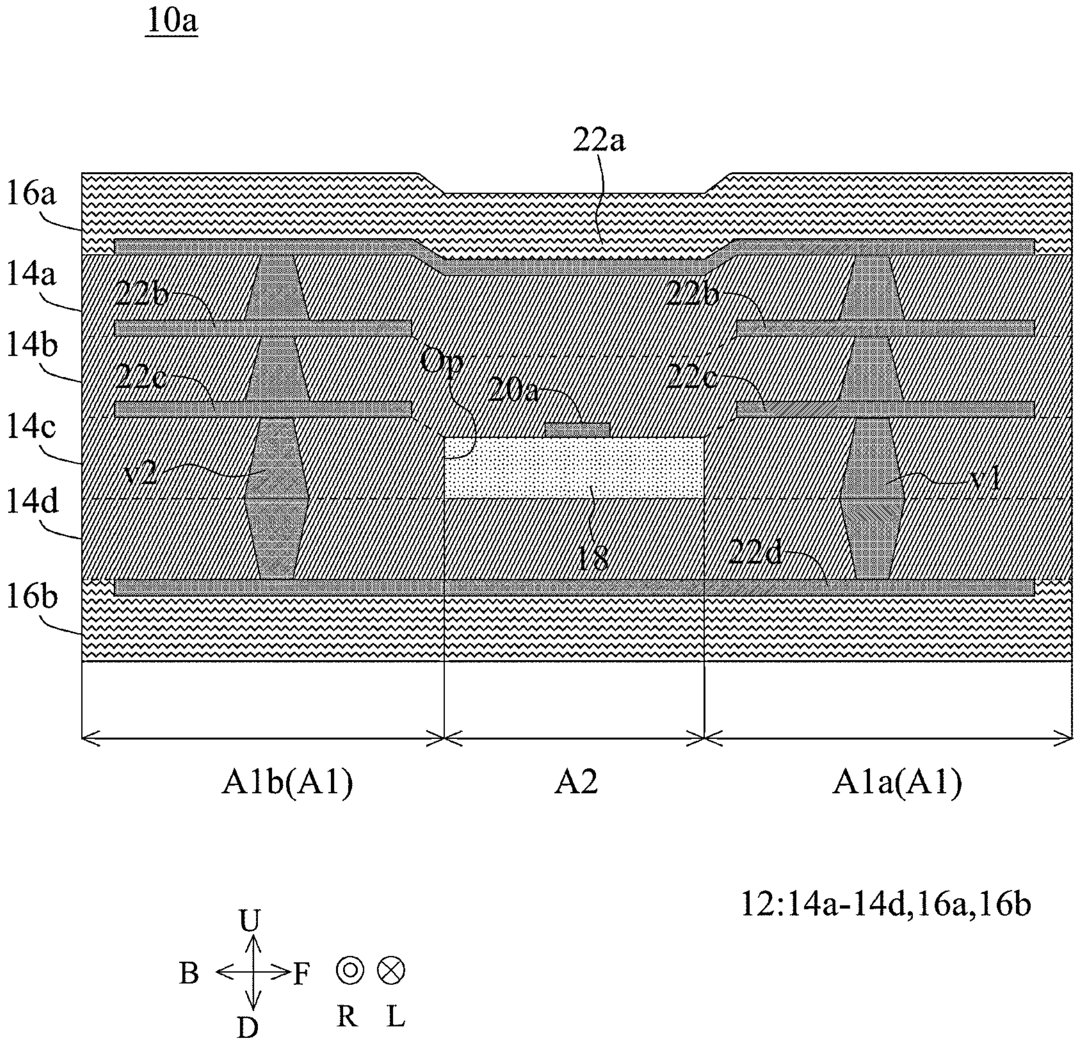
FIG. 5 is a cross-sectional view of a multilayer substrate 10*a*.

Hereinafter, a multilayer substrate 10a according to a first modification will be described with reference to the drawings. FIG. 5 is a cross-sectional view of the multilayer substrate 10a.

The multilayer substrate 10a differs from the multilayer substrate 10 in that a thickness of the second insulator layer 18 in the up-down direction (stacking direction) is smaller than a thickness of the first insulator layer 14c in the up-down direction (stacking direction), the first insulator layer 14c being a small-area first insulator layer overlapping the second insulator layer 18 when viewed in the front-back direction (first direction). Since the other structure of the multilayer substrate 10a is the same as that of the multilayer substrate 10, description thereof will be omitted. The multilayer substrate 10a has the same function and effect as the multilayer substrate 10.

In addition, according to the multilayer substrate 10a, it is possible to further reduce or prevent the crushing of the voids of the second insulator layer 18. More specifically, the thickness of the second insulator layer 18 in the up-down direction (stacking direction) is smaller than the thickness of the first insulator layer 14c in the up-down direction (stacking direction), which is the small-area first insulator layer. Thus, a thickness of the first region A1 in the up-down direction is larger than a thickness of the second region A2 in the up-down direction. Therefore, when the multilayer body 12 is pressure-bonded, the first region A1 is easily pressurized and the second region A2 is hardly pressurized. As a result, the crushing of the voids of the second insulator layer 18 due to application of a large pressure to the second region A2 is further reduced or prevented when the multilayer body 12 is pressure-bonded.

Second Modification

Figure 6:
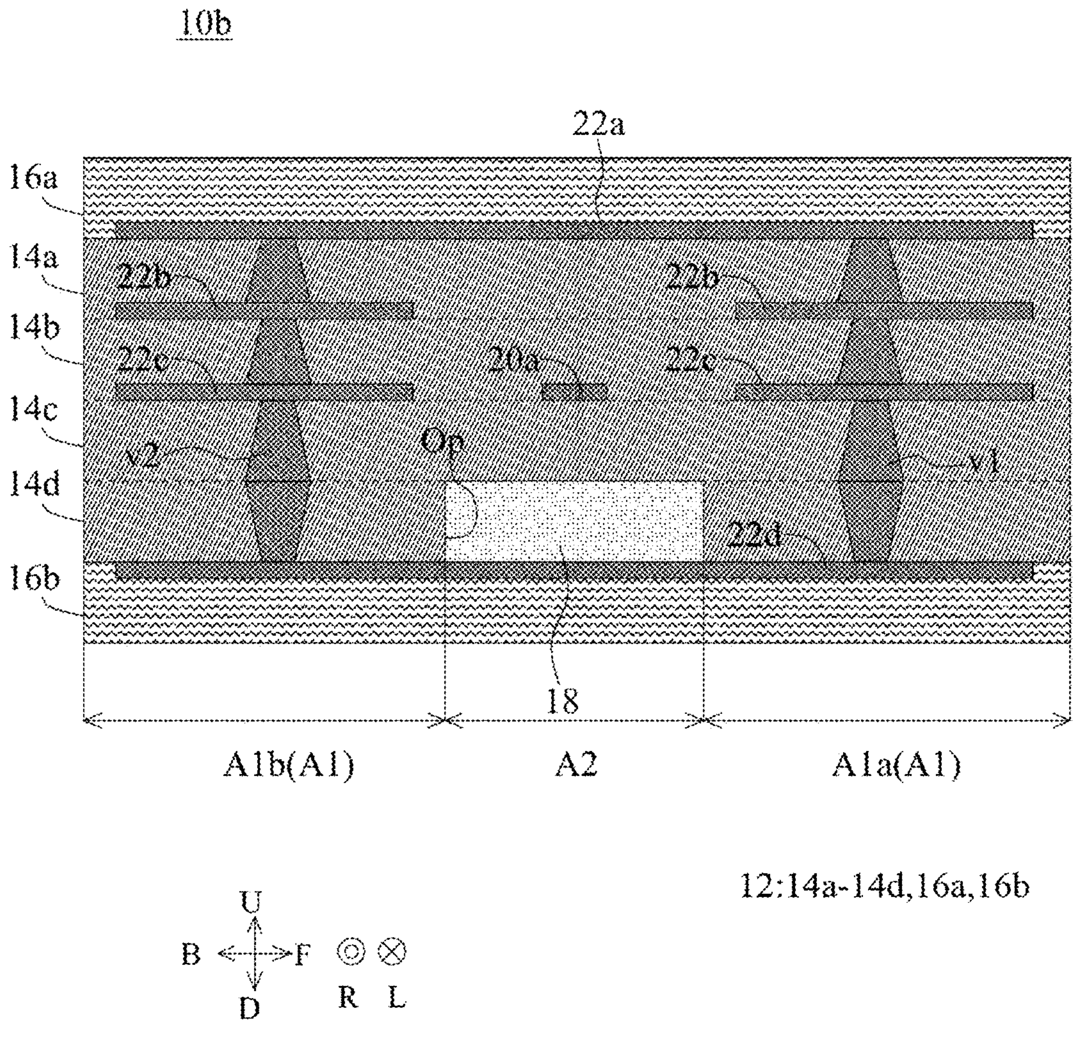
FIG. 6 is a cross-sectional view of a multilayer substrate 10*b*.

Hereinafter, a multilayer substrate 10b according to a second modification will be described with reference to the drawings. FIG. 6 is a cross-sectional view of the multilayer substrate 10b.

The multilayer substrate 10b differs from the multilayer substrate 10 in the position of the second insulator layer 18. More specifically, the first insulator layer 14c is a large-area first insulator layer. The first insulator layer 14d is a small-area first insulator layer. The first insulator layer 14d overlaps the second insulator layer 18 when viewed in the front-back direction (first direction). Since the other structure of the multilayer substrate 10b is the same as that of the multilayer substrate 10, the description thereof is omitted. The multilayer substrate 10b has the same function and effect as the multilayer substrate 10.

Third Modification

Figure 7:
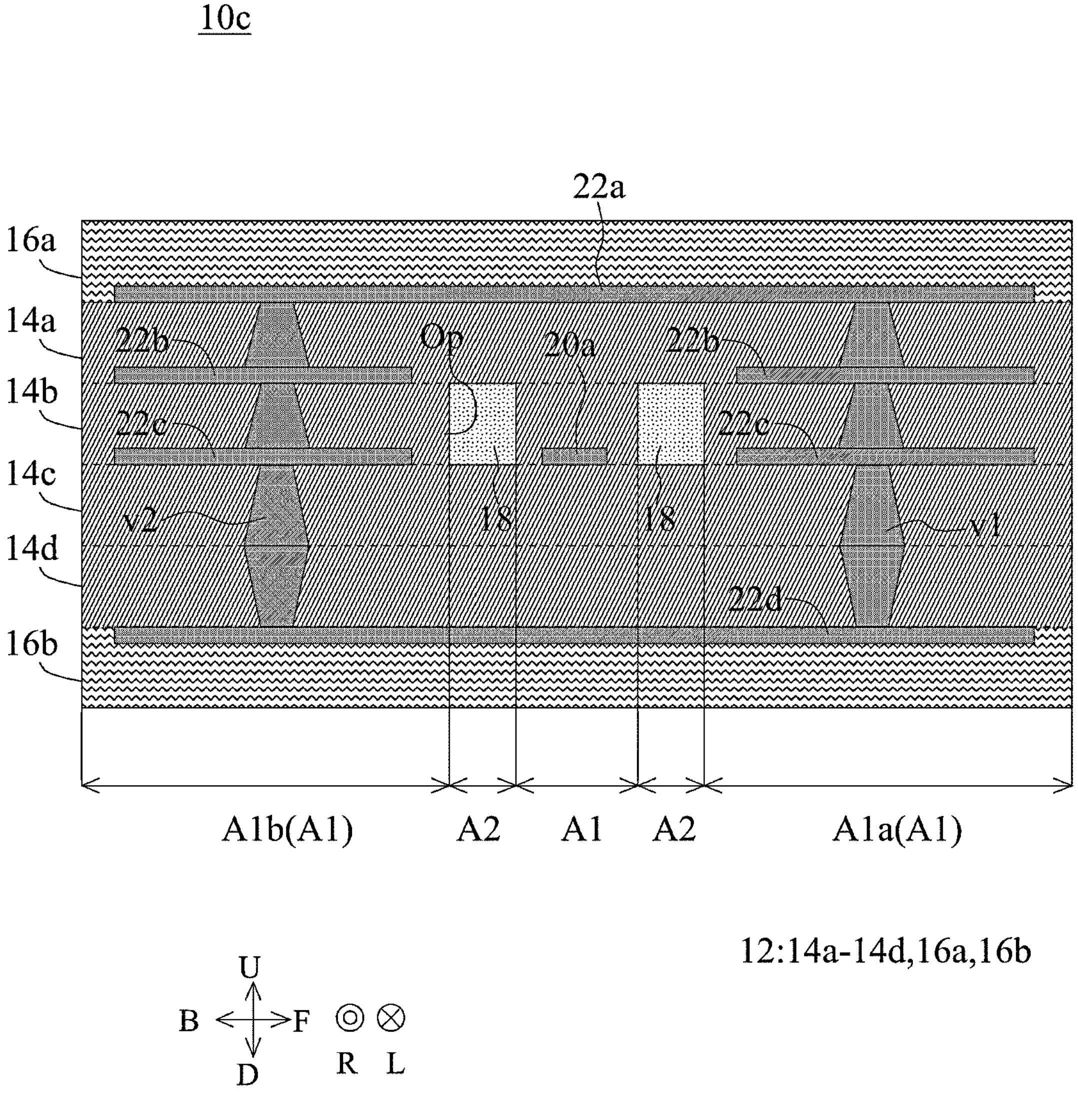
FIG. 7 is a cross-sectional view of a multilayer substrate 10*c*.

Hereinafter, a multilayer substrate 10c according to a third modification will be described with reference to the drawings. FIG. 7 is a cross-sectional view of the multilayer substrate 10c.

The multilayer substrate 10c differs from the multilayer substrate 10 in the position of the second insulator layer 18. More specifically, the second insulator layer 18 does not overlap the signal conductor layers 20a to 20c when viewed in the up-down direction. Therefore, the signal conductor layers 20a to 20c are not located in the second region A2. In the present modification, the first insulator layer 14c is a large-area first insulator layer. The first insulator layer 14b is a small-area first insulator layer. The first insulator layer 14b overlaps the second insulator layer 18 when viewed in the front-back direction (first direction). The second insulator layer 18 is located in front of and behind the signal conductor layer 20a. In addition, there is no conductor layer between the signal conductor layer 20a and the second insulator layer 18. Since the other structure of the multilayer substrate 10*c* is the same as that of the multilayer substrate 10, the description thereof is omitted. The multilayer substrate 10*c* has the same function and effect as the multilayer substrate 10. In addition, even when the signal conductor layers 20*a* to 20*c* are not located in the second region A2, since the multilayer body 12 includes the second insulator layer 18, the dielectric constant in the vicinity of the signal conductor layers 20*a* to 20*c* is low. As a result, the loss of the high-frequency signals transmitted through the signal conductor layers 20*a* to 20*c* is reduced.

Fourth Modification

Figure 8:
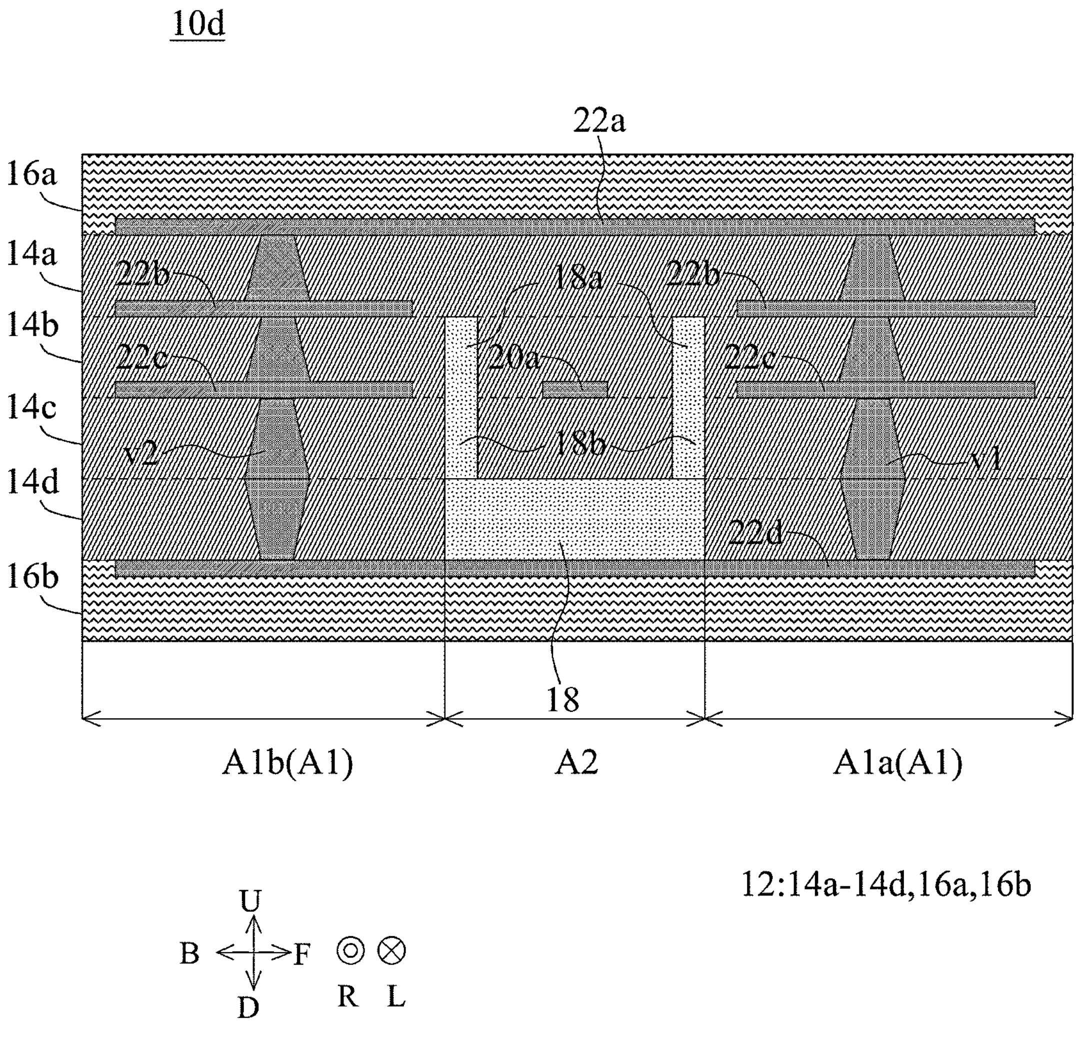
FIG. 8 is a cross-sectional view of a multilayer substrate 10*d*.

Hereinafter, a multilayer substrate 10*d* according to a fourth modification will be described with reference to the drawings. FIG. 8 is a cross-sectional view of the multilayer substrate 10*d*.

The multilayer substrate 10*d* differs from the multilayer substrate 10*b* in that the multilayer body 12 further includes more than one second insulator layers. More specifically, the multilayer substrate 10*d* further includes second insulator layers 18*a* and 18*b*, and the second insulator layers 18*a* and 18*b* are located in front of and behind the signal conductor layer 20*a*. The second insulator layer 18*a* and the second insulator layer 18*b* have the same shape when viewed in the up-down direction. The second insulator layers 18*a* and 18*b* are smaller than the second insulator layer 18 when viewed in the up-down direction. In addition, the second insulator layer 18*a*, the second insulator layer 18*b*, and the second insulator layer 18 overlap each other when viewed in the up-down direction. Since the other structure of the multilayer substrate 10*d* is the same as that of the multilayer substrate 10*b*, description thereof is omitted. The multilayer substrate 10*d* has the same function and effect as the multilayer substrate 10*b*.

Fifth Modification

Figure 9:
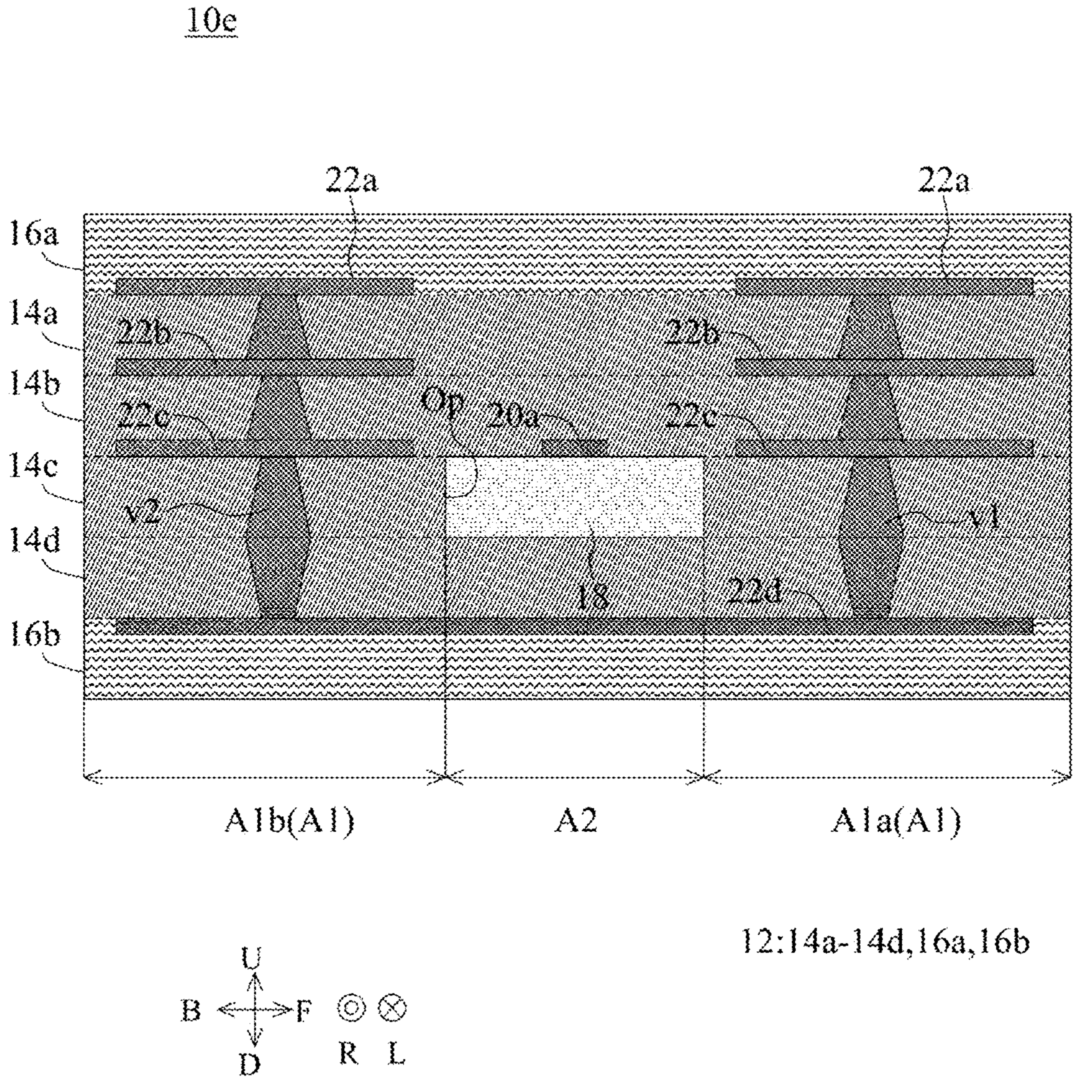
FIG. 9 is a cross-sectional view of a multilayer substrate 10*e*.
Figure 10:
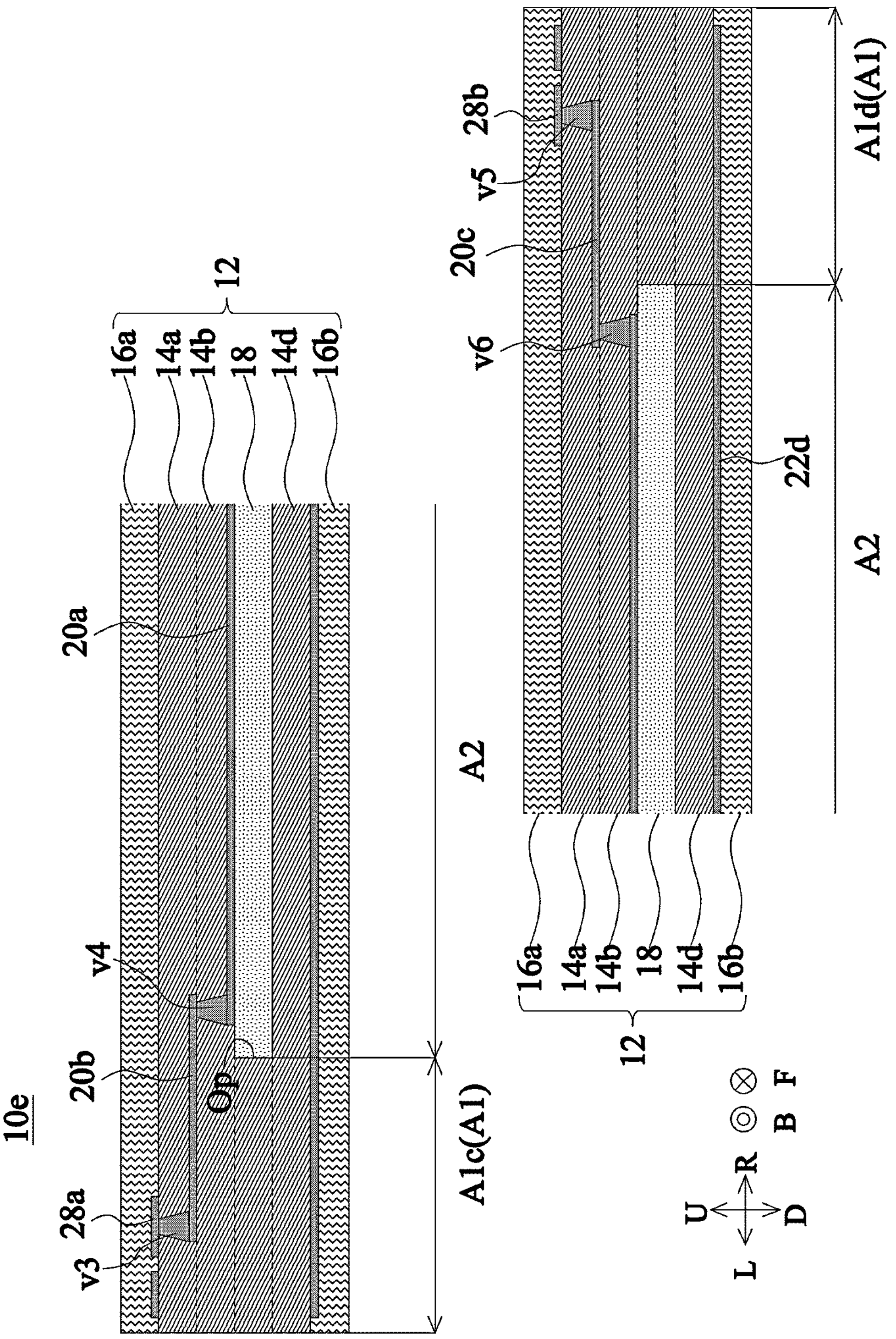
FIG. 10 is a cross-sectional view of the multilayer substrate 10*e*.

Hereinafter, a multilayer substrate 10*e* according to a fifth modification will be described with reference to the drawings. FIG. 9 and FIG. 10 are cross-sectional views of the multilayer substrate 10*e*.

The multilayer substrate 10*e* differs from the multilayer substrate 10 in that it has a microstrip line structure. Therefore, the reference conductor layer 22*a* does not overlap the signal conductor layers 20*a* to 20*c* when viewed in the up-down direction. Since the other structure of the multilayer substrate 10*e* is the same as that of the multilayer substrate 10, the description thereof is omitted. The multilayer substrate 10*e* has the same function and effect as the multilayer substrate 10.

Sixth Modification

Figure 11:
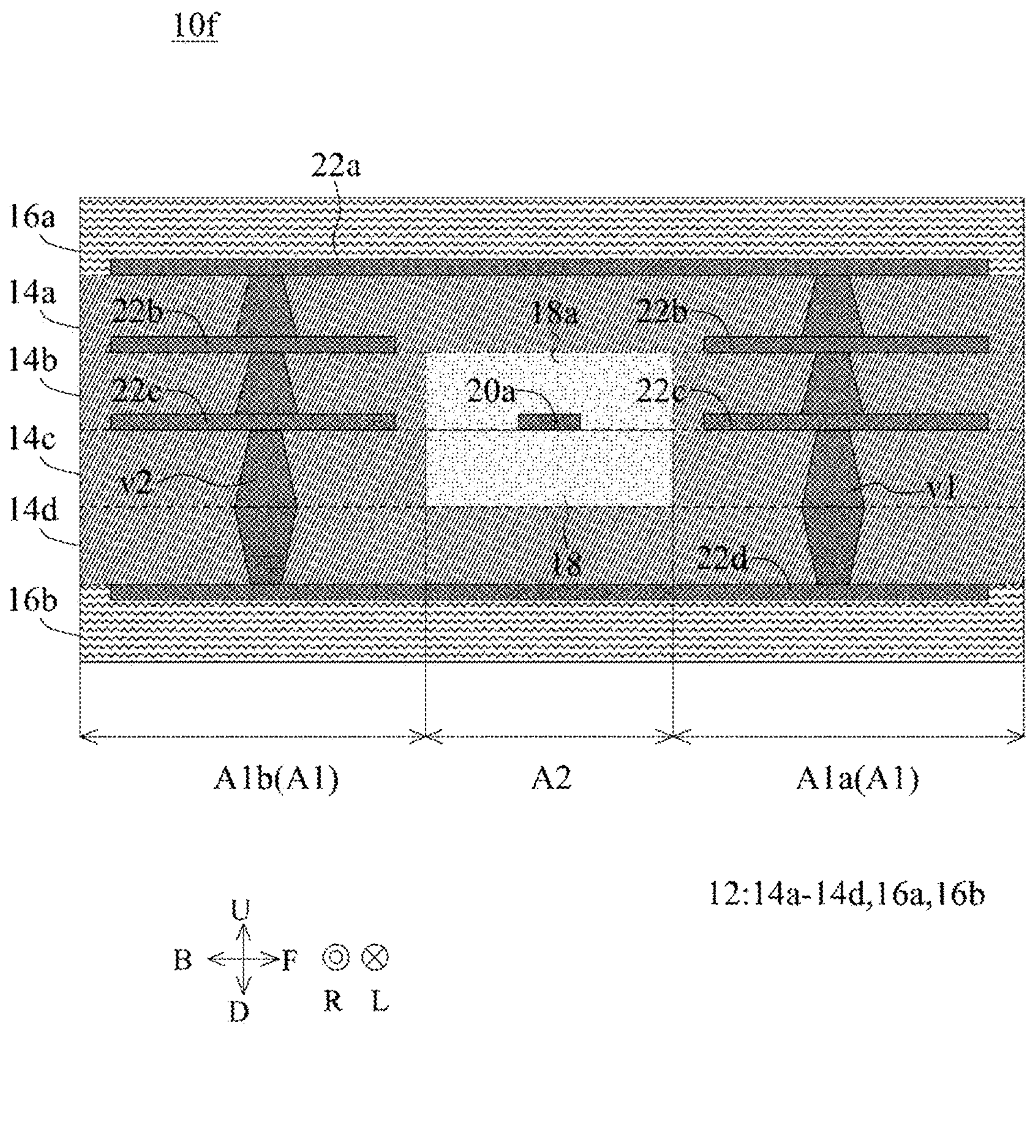
FIG. 11 is a cross-sectional view of a multilayer substrate 10*f*.
Figure 12:
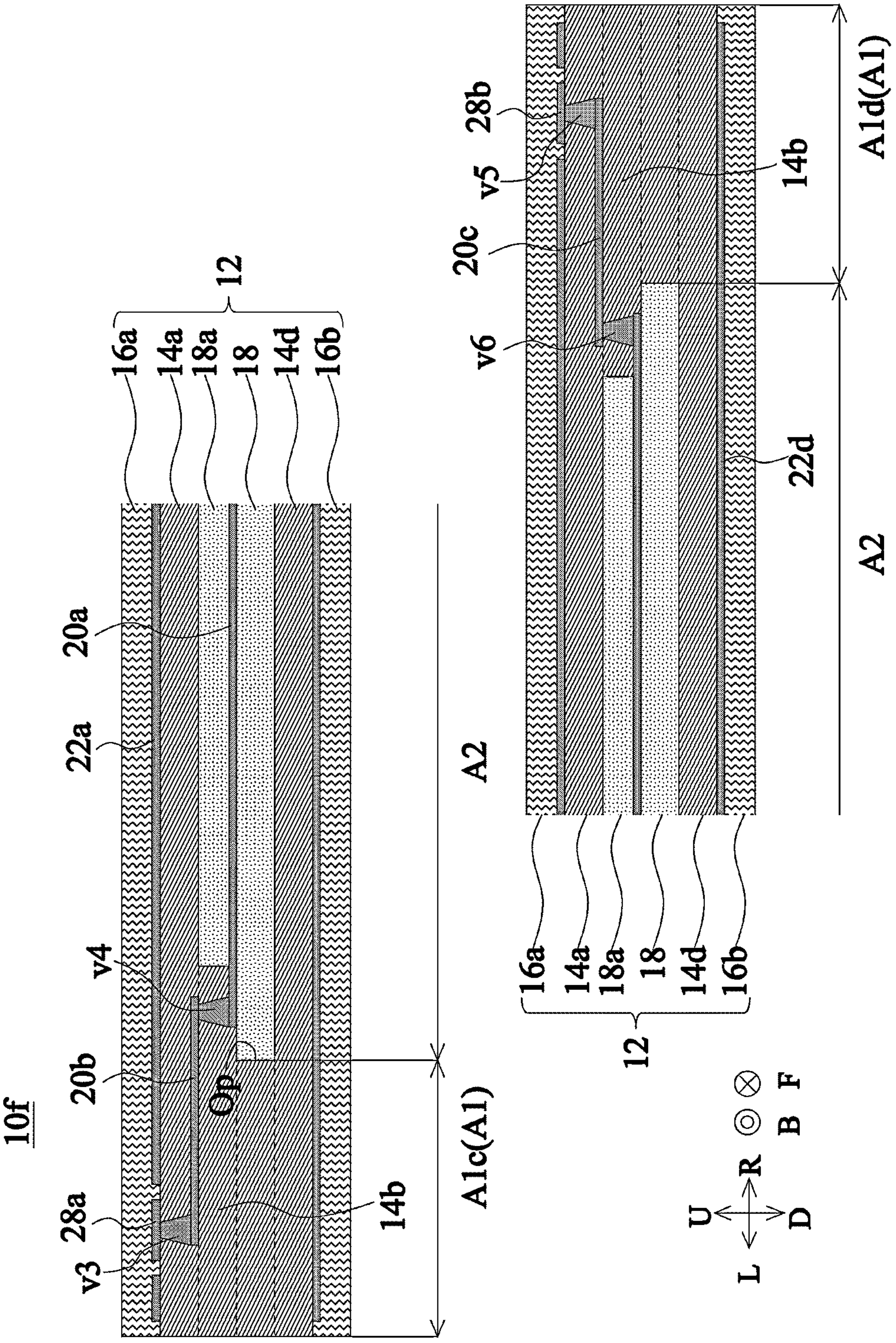
FIG. 12 is a cross-sectional view of the multilayer substrate 10*f*.

Hereinafter, a multilayer substrate 10*f* according to a sixth modification will be described with reference to the drawings. FIG. 11 and FIG. 12 are cross-sectional views of the multilayer substrate 10*f*.

The multilayer substrate 10*f* differs from the multilayer substrate 10 in that it further includes the second insulator layer 18*a*. The first insulator layers 14*a* and 14*d* are large-area first insulator layers. The first insulator layers 14*b* and 14*c* are small-area first insulator layers. The first insulator layer 14*b* overlaps the second insulator layer 18*a* when viewed in the front-back direction (first direction). The first insulator layer 14*c* overlaps the second insulator layer 18 when viewed in the front-back direction (first direction). Thus, the signal conductor layer 20*a* is surrounded by the second insulator layers 18 and 18*a* when viewed in the left-right direction. Since the other structure of the multilayer substrate 10*f* is the same as that of the multilayer substrate 10, the description thereof is omitted. The multilayer substrate 10*f* has the same function and effect as the multilayer substrate 10.

In addition, according to the multilayer substrate 10*f*, the signal conductor layer 20*a* is surrounded by the second insulator layers 18 and 18*a* when viewed in the left-right direction. Thus, the dielectric constant in the vicinity of the signal conductor layer 20*a* is further reduced. As described above, according to the multilayer substrate 10*f*, the loss of the high-frequency signals transmitted through the signal conductor layers 20*a* to 20*c* is further reduced.

Seventh Modification

Figure 13:
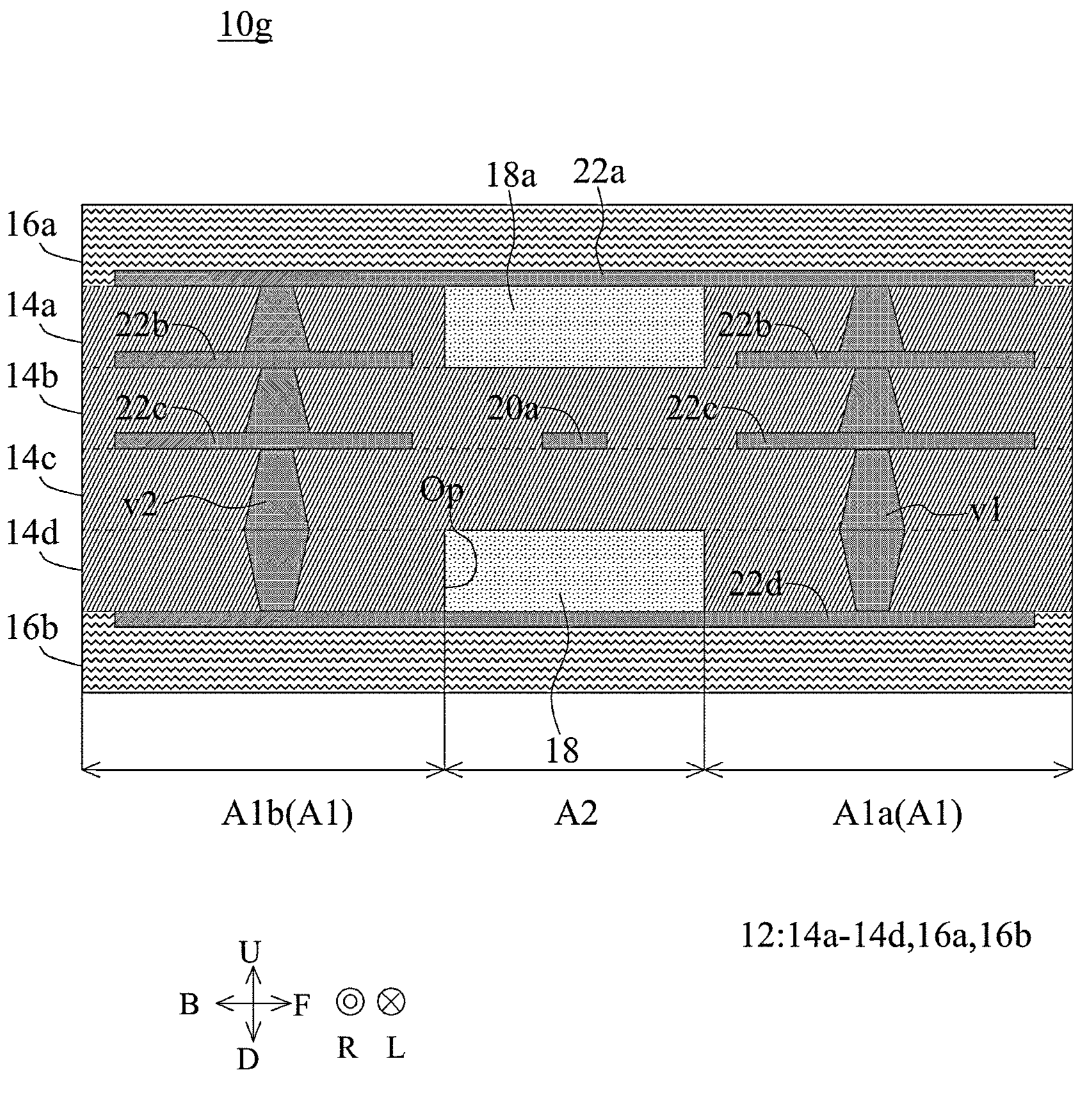
FIG. 13 is a cross-sectional view of a multilayer substrate 10*g*.

Hereinafter, a multilayer substrate 10*g* according to a seventh modification will be described with reference to the drawings. FIG. 13 is a cross-sectional view of the multilayer substrate 10*g*.

The multilayer substrate 10*g* differs from the multilayer substrate 10*f* in the position of the second insulator layers 18 and 18*a*. The second insulator layers 18 and 18*a* are not in contact with the signal conductor layer 20*a*. The first insulator layers 14*b* and 14*c* are large-area first insulator layers. The first insulator layers 14*a* and 14*d* are small-area first insulator layers. The first insulator layer 14*a* overlaps the second insulator layer 18*a* when viewed in the front-back direction (first direction). The first insulator layer 14*d* overlaps the second insulator layer 18 when viewed in the front-back direction (first direction). Since the other structure of the multilayer substrate 10*g* is the same as that of the multilayer substrate 10*f*, description thereof is omitted. The multilayer substrate 10*g* has the same function and effect as the multilayer substrate 10.

Eighth Modification

Figure 14:
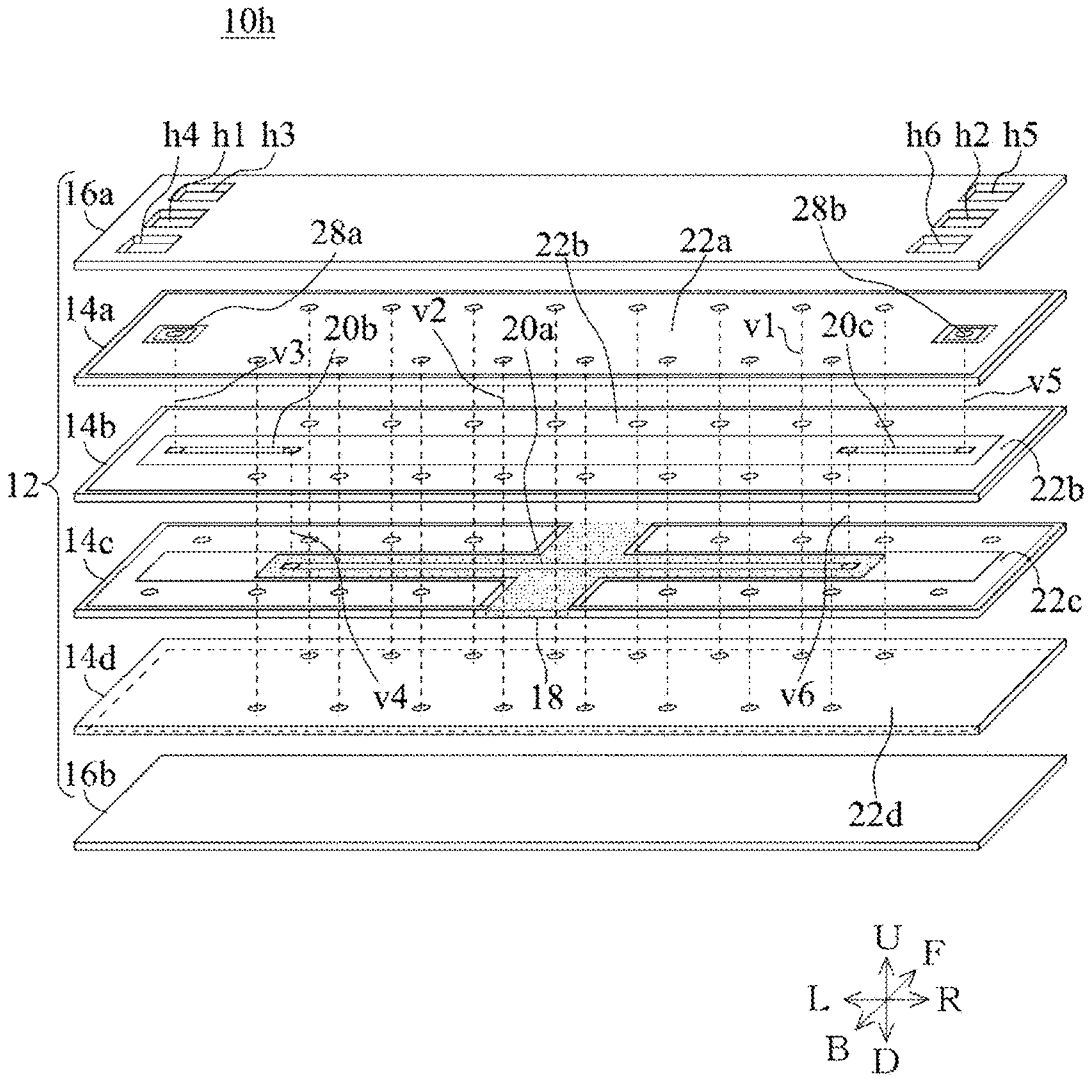
FIG. 14 is an exploded perspective view of a multilayer substrate 10*h*.

A multilayer substrate 10*h* according to an eighth modification will be described below with reference to the drawings. FIG. 14 is an exploded perspective view of the multilayer substrate 10*h*.

The multilayer substrate 10*h* differs from the multilayer substrate 10 in the shape of the second insulator layer 18. More specifically, when viewed in the up-down direction (stacking direction), the second insulator layer 18 connects both ends of the multilayer body 12 in the front-back direction. That is, the second insulator layer 18 crosses the multilayer body 12 in the front-back direction when viewed in the up-down direction. Thus, when viewed in the up-down direction (stacking direction), the second region A2 connects the both ends of the multilayer body 12 in the front-back direction (first direction). The multilayer substrate 10*h* like this is bent at a portion in which the second region A2 connects the both ends of the multilayer body 12 in the front-back direction. That is, a portion in which the second region A2 connects the both ends of the multilayer body 12 in the front-back direction is included in the large deformation region A113 of FIG. 4. Therefore, in the method for manufacturing the multilayer substrate 10*h*, when viewed in the up-down direction (stacking direction), a portion in which the second region A2 connects the both ends of the multilayer body 12 in the front-back direction (first direction) is bent in the bending step. Since the other structure of the multilayer substrate 10*h* is the same as that of the multilayer substrate 10, the description thereof is omitted. The multilayer substrate 10*h* has the same function and effect as the multilayer substrate 10.

In addition, when viewed in the up-down direction (stacking direction), the second insulator layer 18 connects the both ends of the multilayer body 12 in the front-back direction (first direction), so that the second region A2 connects the both ends of the multilayer body 12 in the front-back direction. The second insulator layer 18 is more easily deformed than the first insulator layers 14*a* to 14*d*. Therefore, the multilayer substrate 10*h* can be easily bent.

Ninth Modification

Figure 15:
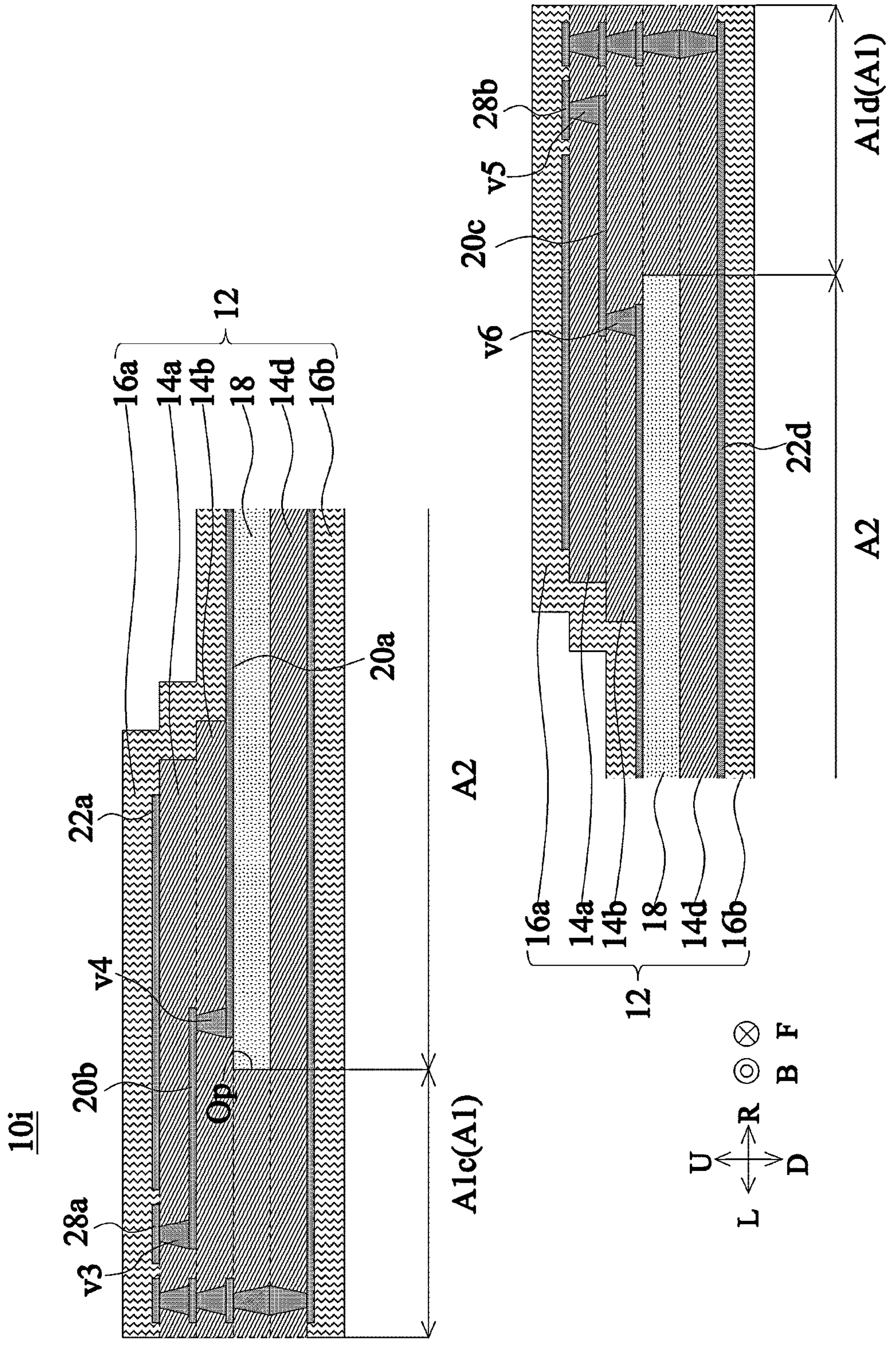
FIG. 15 is a cross-sectional view of a multilayer substrate 10*i*.

Hereinafter, a multilayer substrate 10*i* according to a ninth modification will be described with reference to the drawings. FIG. 15 is a cross-sectional view of the multilayer substrate 10*i*.

The multilayer substrate 10*i* differs from the multilayer substrate 10 in that a portion of the first insulator layer 14*a*, a portion of the first insulator layer 14*b*, and a portion of the protective layer 16*a* are not present. Thus, the first insulator layers 14*a* and 14*b* are not present in the large deformation region A113 of FIG. 4. Since the other structure of the multilayer substrate 10*i* is the same as that of the multilayer substrate 10, the description thereof is omitted. The multilayer substrate 10*i* has the same function and effect as the multilayer substrate 10.

In addition, in the multilayer substrate 10*i*, a portion of the first insulator layer 14*a* and a portion of the first insulator layer 14*b* do not present. This makes it easy to bend the large deformation region A113.

Tenth Modification

Figure 16:
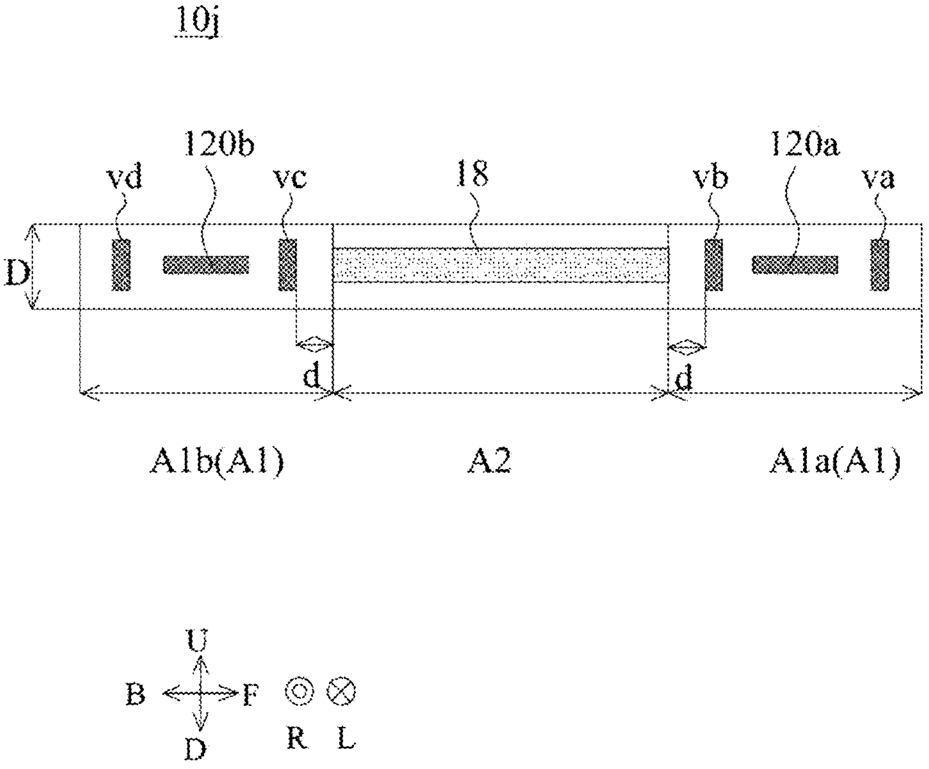
FIG. 16 is a cross-sectional view of a multilayer substrate 10*j*.
Figure 17:
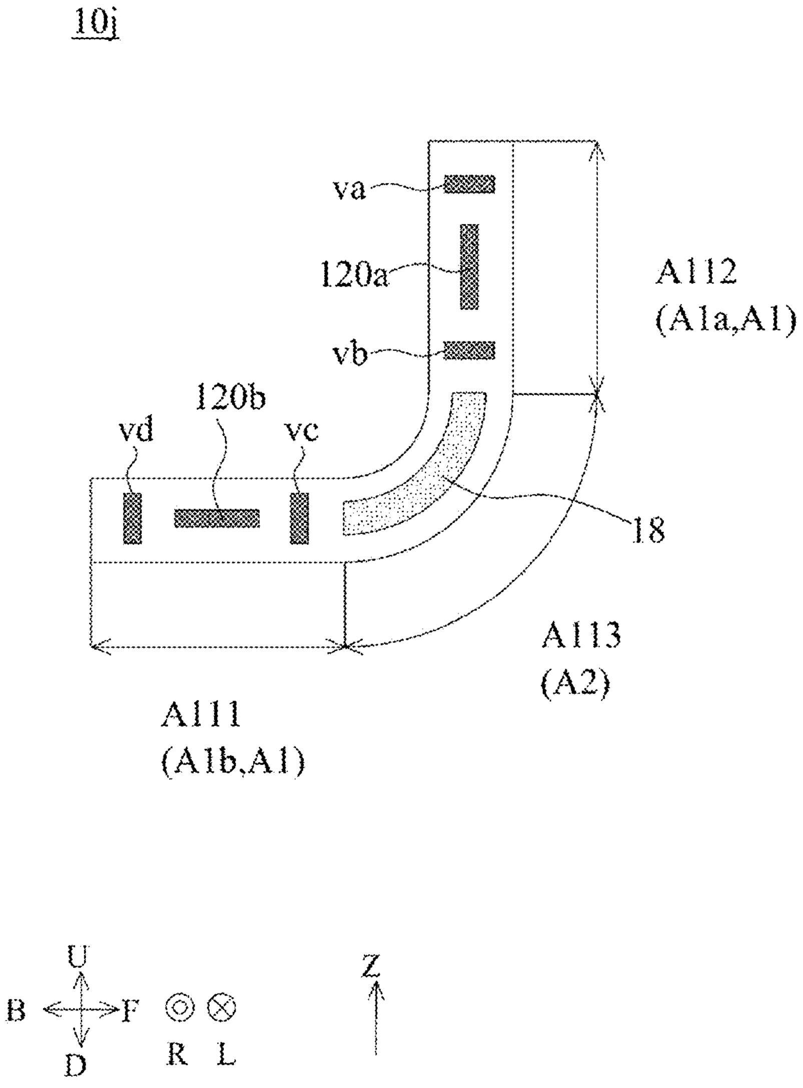
FIG. 17 is a cross-sectional view of the multilayer substrate 10*j*.
Figure 18:
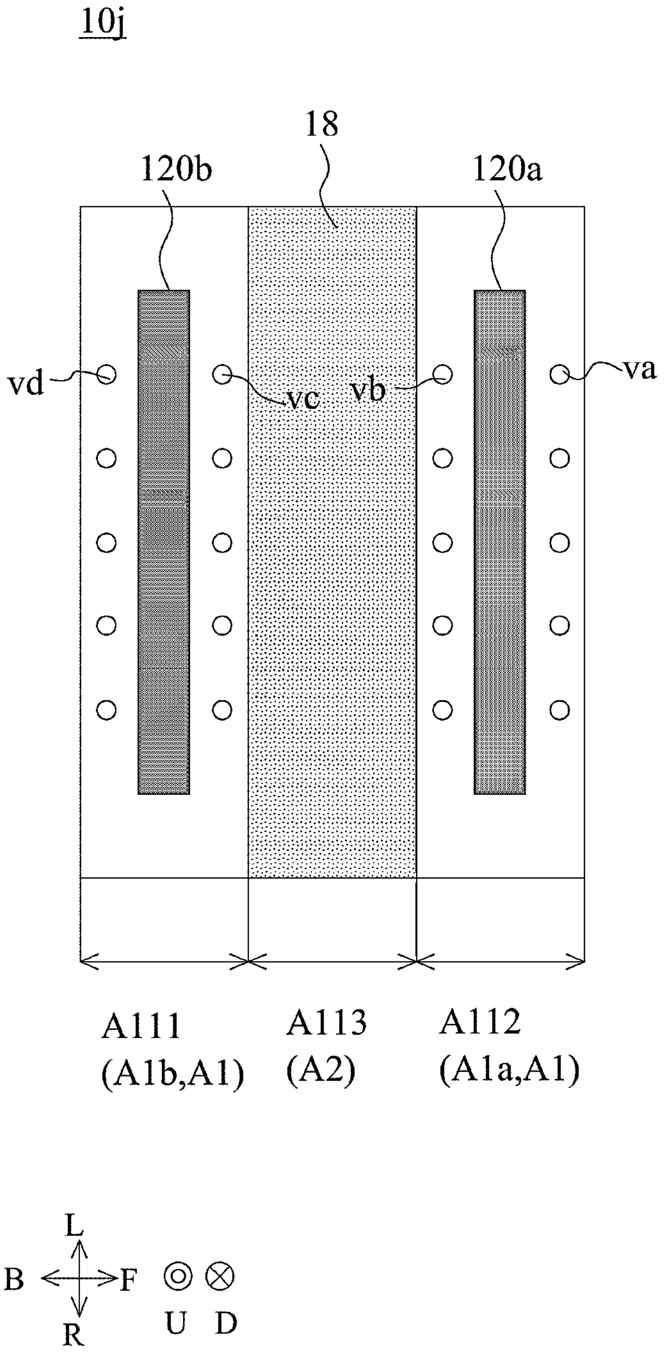
FIG. 18 is a top view of the multilayer substrate 10*j*.

Hereinafter, a multilayer substrate 10*j* according to a tenth modification will be described with reference to the drawings. FIG. 16 and FIG. 17 are cross-sectional views of the multilayer substrate 10*j*. FIG. 18 is a top view of the multilayer substrate 10*j*. FIG. 18 is a perspective view of the inside of the multilayer substrate 10*j*.

The multilayer substrate 10*j* differs from the multilayer substrate 10 in that it includes signal conductor layers 120*a* and 120*b* and interlayer connection conductors va to vd. The signal conductor layers 120*a* and 120*b* are provided in the multilayer body 12. The signal conductor layer 120*a* extends in the left-right direction in the first region front portion A1*a*. The signal conductor layer 120*a* (first signal conductor layer) is not located in the second region A2. The signal conductor layer 120*b* extends in the left-right direction in the first region rear portion A1*b*. The signal conductor layer 120*b* (second signal conductor layer) is not located in the second region A2. Thus, the second insulator layer 18 is located between the signal conductor layer 120*a* (first signal conductor layer) and the signal conductor layer 120*b* (second signal conductor layer) when viewed in the up-down direction (stacking direction).

The interlayer connection conductors va and vb are provided in the first region front portion A1*a*. The interlayer connection conductor vb is located between the signal conductor layer 120*a* and the second insulator layer 18. Therefore, a distance between the interlayer connection conductor vb and the second insulator layer 18 is shorter than a distance between the interlayer connection conductor va and the second insulator layer 18. A thickness D of the multilayer body 12 in the up-down direction (stacking direction) is greater than a shortest distance d between the interlayer connection conductor vb and the second insulator layer 18 when viewed in the up-down direction (stacking direction).

The interlayer connection conductors vc and vd are provided in the first region rear portion A1*b*. In addition, the interlayer connection conductor vc is located between the signal conductor layer 120*b* and the second insulator layer 18. Therefore, a distance between the interlayer connection conductor vc and the second insulator layer 18 is shorter than a distance between the interlayer connection conductor vd and the second insulator layer 18. The thickness D of the multilayer body 12 in the up-down direction (stacking direction) is greater than a shortest distance d between the interlayer connection conductor vc and the second insulator layer 18 when viewed in the up-down direction (stacking direction).

The multilayer substrate 10*j* described above is bent in the second region A2. Therefore, the second region A2 coincides with the large deformation region A113 when viewed in the front-back direction. Since the other structure of the multilayer substrate 10*j* is the same as that of the multilayer substrate 10, the description thereof is omitted. The multilayer substrate 10*j* has the same function and effect as the multilayer substrate 10.

In addition, according to the multilayer substrate 10*j*, crosstalk between the signal conductor layers 120*a* and 120*b* is reduced. More specifically, as illustrated in FIG. 16, when the multilayer substrate 10*j* is not bent, the second insulator layer 18 is located between the signal conductor layers 120*a* and 120*b*. The second insulator layer 18 has a low dielectric constant. Therefore, the electromagnetic wave is unlikely to propagate through the second insulator layer 18. As a result, according to the multilayer substrate 10*j*, crosstalk between the signal conductor layers 120*a* and 120*b* is reduced or prevented.

Eleventh Modification

Figure 19:
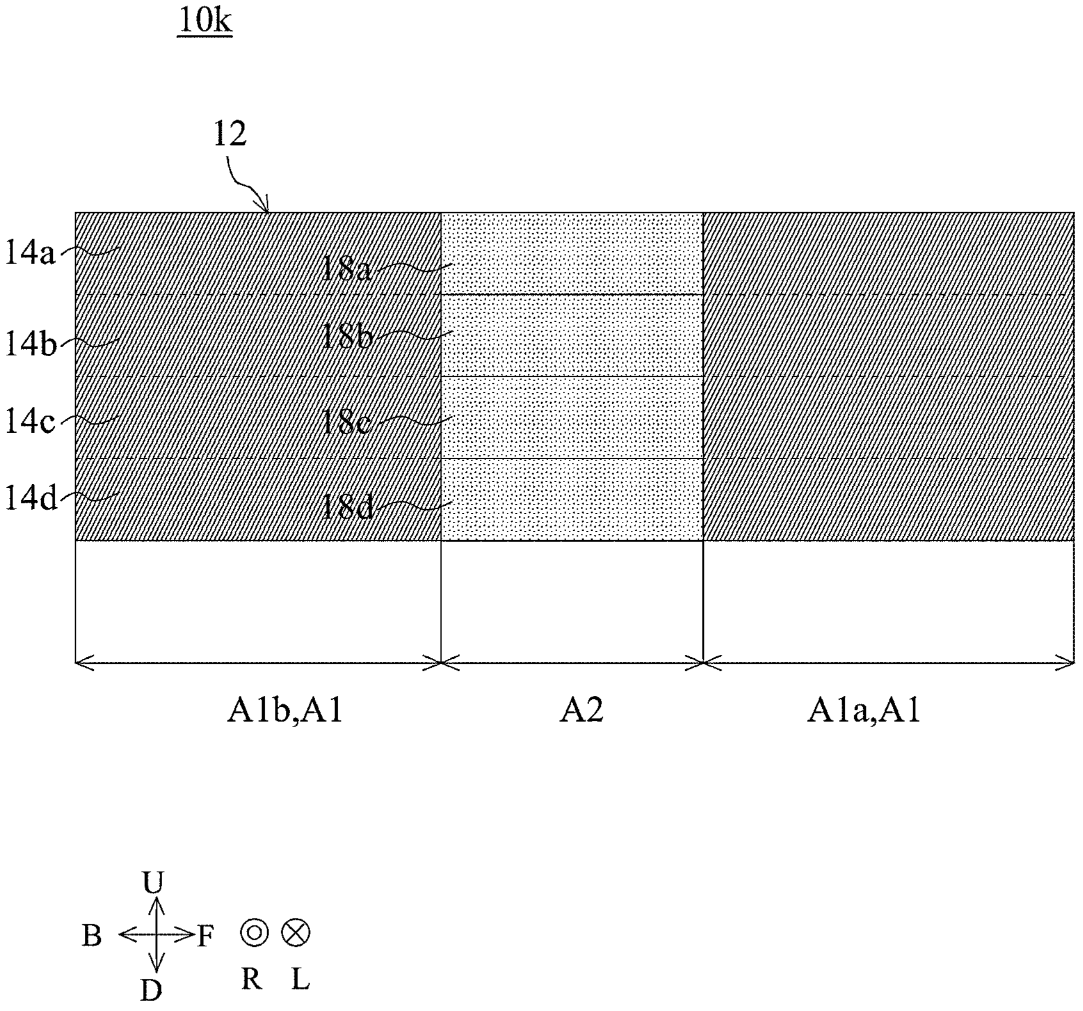
FIG. 19 is a cross-sectional view of a multilayer substrate 10*k*.
Figure 20:
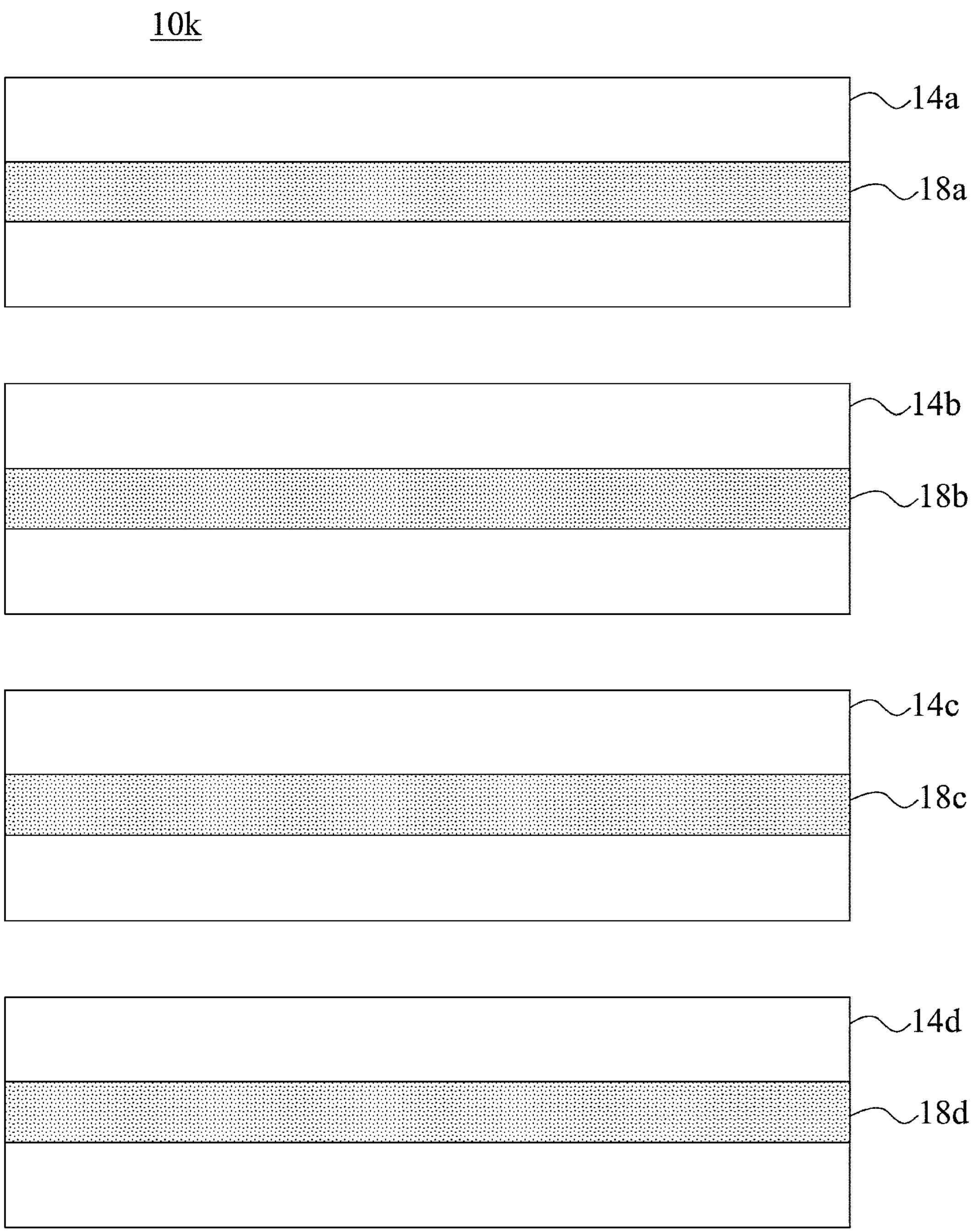
FIG. 20 is an exploded view of the multilayer substrate 10*k*.

Hereinafter, a multilayer substrate 10*k* according to an eleventh modification will be described with reference to the drawings. FIG. 19 is a cross-sectional view of the multilayer substrate 10*k*. FIG. 20 is an exploded view of the multilayer substrate 10*k*. Note that in FIG. 19 and FIG. 20, only the insulator layer is illustrated.

As illustrated in the multilayer substrate 10*k*, the multilayer body 12 may include the second insulator layers 18*a* and 18*b*, and second insulator layers 18*c* and 18*d*. The second insulator layers 18*a* to 18*d* have the same shape when viewed in the up-down direction. The second insulator layers 18*a* to 18*d* overlap each other when viewed in the up-down direction. The first insulator layer 14*a* overlaps the second insulator layer 18*a* when viewed in the front-back direction. The first insulator layer 14*b* overlaps the second insulator layer 18*b* when viewed in the front-back direction. The first insulator layer 14*c* overlaps the second insulator layer 18*c* when viewed in the front-back direction. The first insulator layer 14*d* overlaps the second insulator layer 18*d* when viewed in the front-back direction. Thus, in the first region A1, the first insulator layers 14*a* to 14*d* are stacked. The second insulator layers 18*a* to 18*d* are stacked in the second region A2. Since the other structure of the multilayer substrate 10*k* is the same as that of the multilayer substrate 10, the description thereof is omitted. The multilayer substrate 10*k* has the same function and effect as the multilayer substrate 10.

Twelfth Modification

Figure 21:
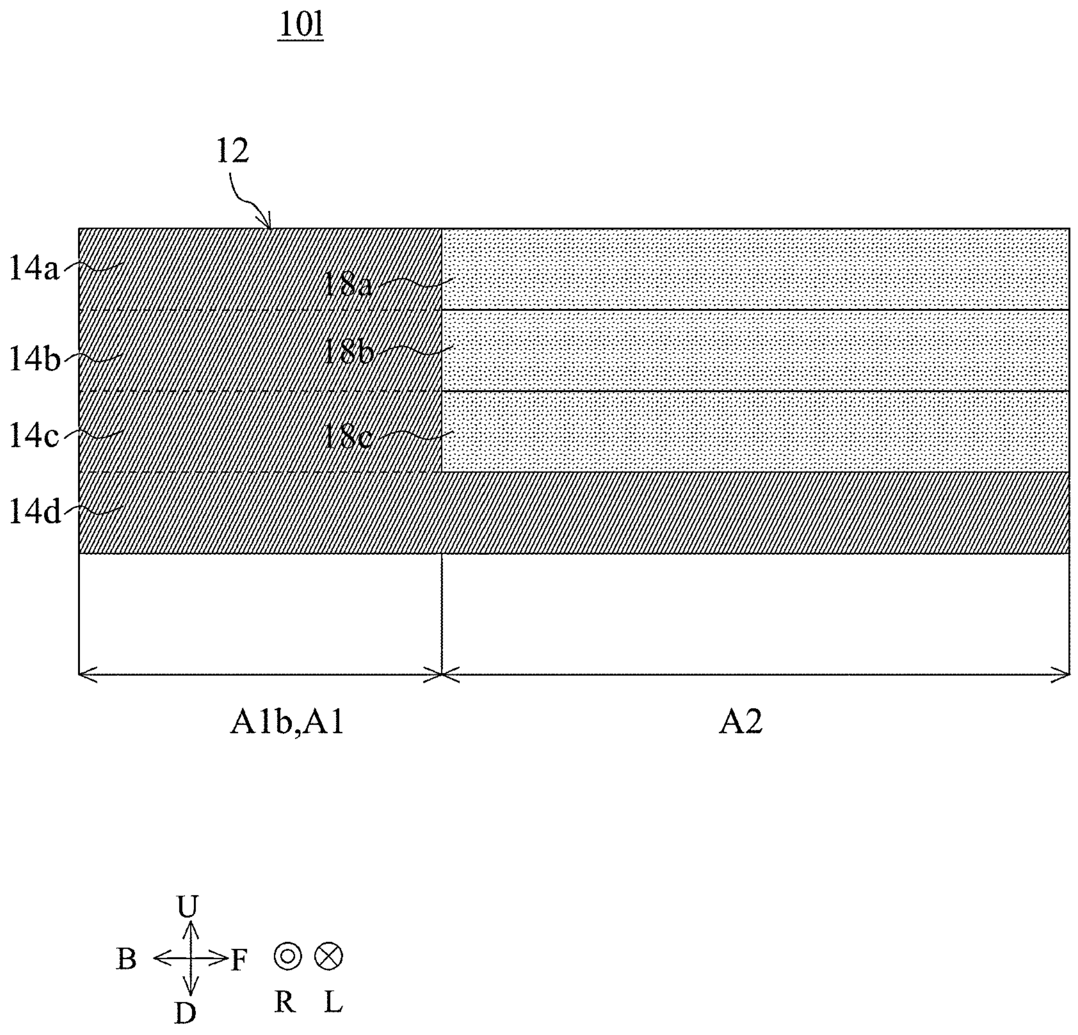
FIG. 21 is a cross-sectional view of a multilayer substrate 10*l*.
Figure 22:
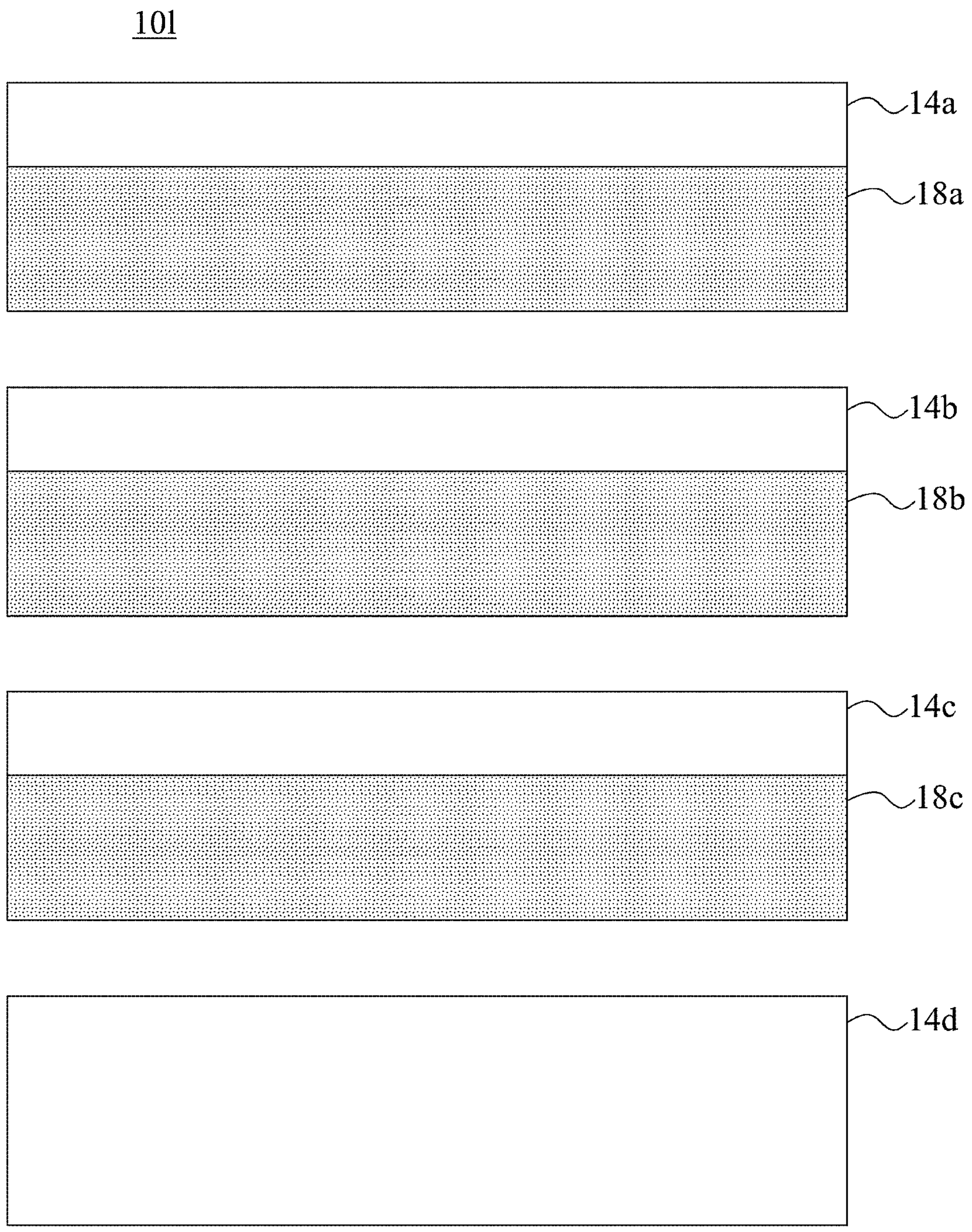
FIG. 22 is an exploded view of the multilayer substrate 10*l*.

Hereinafter, a multilayer substrate **10*l* according to a twelfth modification will be described with reference to the drawings. FIG. 21 is a cross-sectional view of the multilayer substrate 10*l*. FIG. 22 is an exploded view of the multilayer substrate 10*l*. Note that in FIG. 21 and FIG. 22**, only the insulator layer is illustrated.

As illustrated in the multilayer substrate **10*l*, the multilayer body 12 may include the second insulator layers 18*a* to 18*c*. The second insulator layers 18*a* to 18*c* have the same shape when viewed in the up-down direction. The second insulator layers 18*a* to 18*c* overlap each other when viewed in the up-down direction. The first insulator layer 14*a* overlaps the second insulator layer 18*a* when viewed in the front-back direction. The first insulator layer 14*b* overlaps the second insulator layer 18*b* when viewed in the front-back direction. The first insulator layer 14*c* overlaps the second insulator layer 18*c* when viewed in the front-back direction. However, the first insulator layers 14*a* to 14*c* are not located in front of the second insulator layers 18*a* to 18*c***. Therefore, the first region front portion A1*a* is not present in the multilayer substrate **10*l*. Since the other structure of the multilayer substrate 10*l* is the same as that of the multilayer substrate 10, the description thereof is omitted. The multilayer substrate 10*l* has the same function and effect as the multilayer substrate 10**.

Thirteenth Modification

Figure 23:
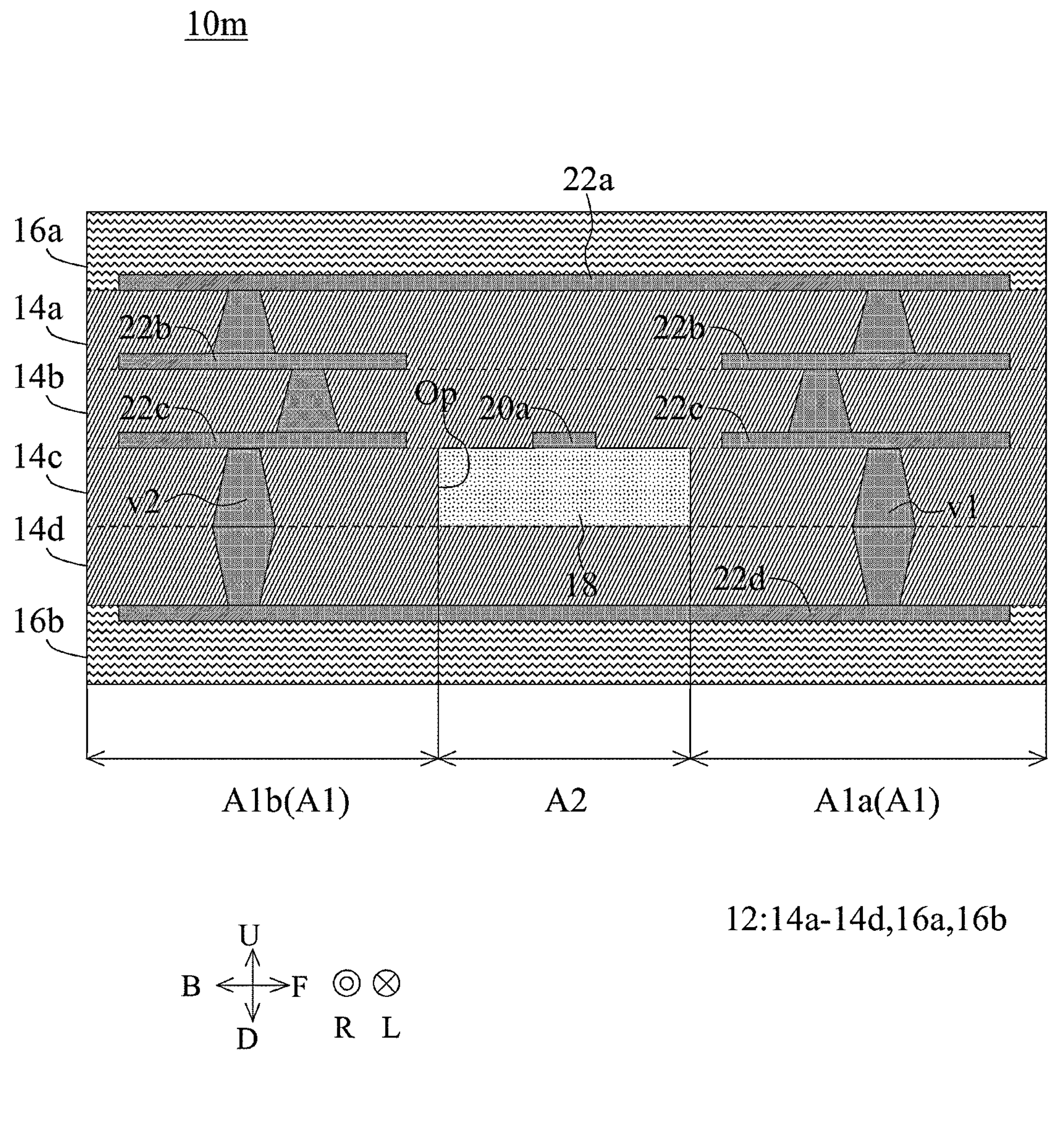
FIG. 23 is a cross-sectional view of a multilayer substrate 10*m*.
Figure 24:
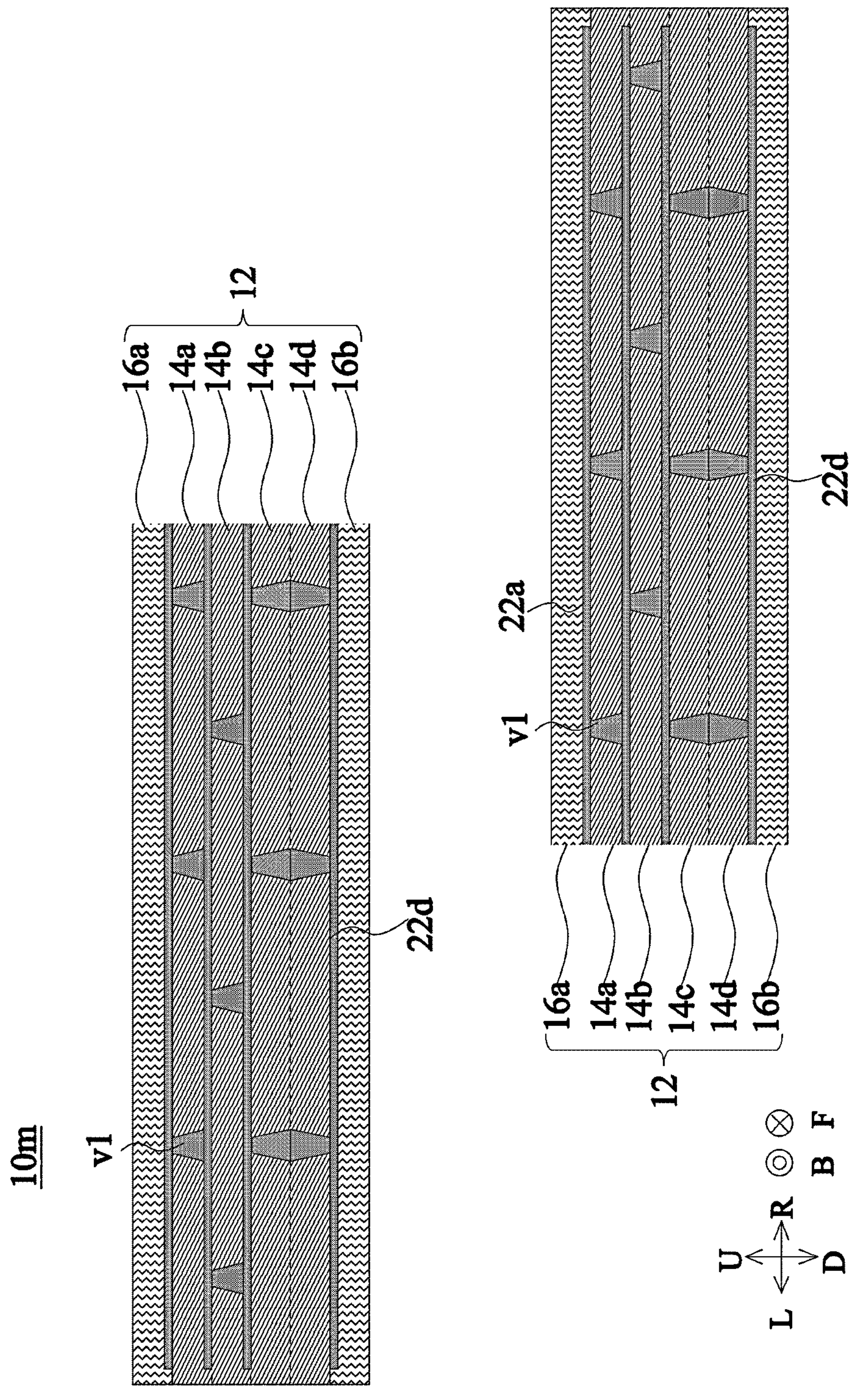
FIG. 24 is a cross-sectional view of the multilayer substrate 10*m*.

Hereinafter, a multilayer substrate **10*m* according to a thirteenth modification will be described with reference to the drawings. FIG. 23 and FIG. 24 are cross-sectional views of the multilayer substrate 10*m***.

The multilayer substrate **10*m* differs from the multilayer substrate 10 in the structure of the interlayer connection conductors v1 and v2. The interlayer connection conductors v1 and v2 of the multilayer substrate 10 have a structure in which a plurality of interlayer connection conductors penetrating through the first insulator layers 14*a* to 14*d* in the up-down direction is arranged in a line in the up-down direction. On the other hand, the interlayer connection conductors v1 and v2 of the multilayer substrate 10*m* meander when viewed in the front-back direction and the left-right direction. Since the other structure of the multilayer substrate 10*m* is the same as that of the multilayer substrate 10, the description thereof is omitted. The multilayer substrate 10*m* has the same function and effect as the multilayer substrate 10**.

Fourteenth Modification

Figure 25:
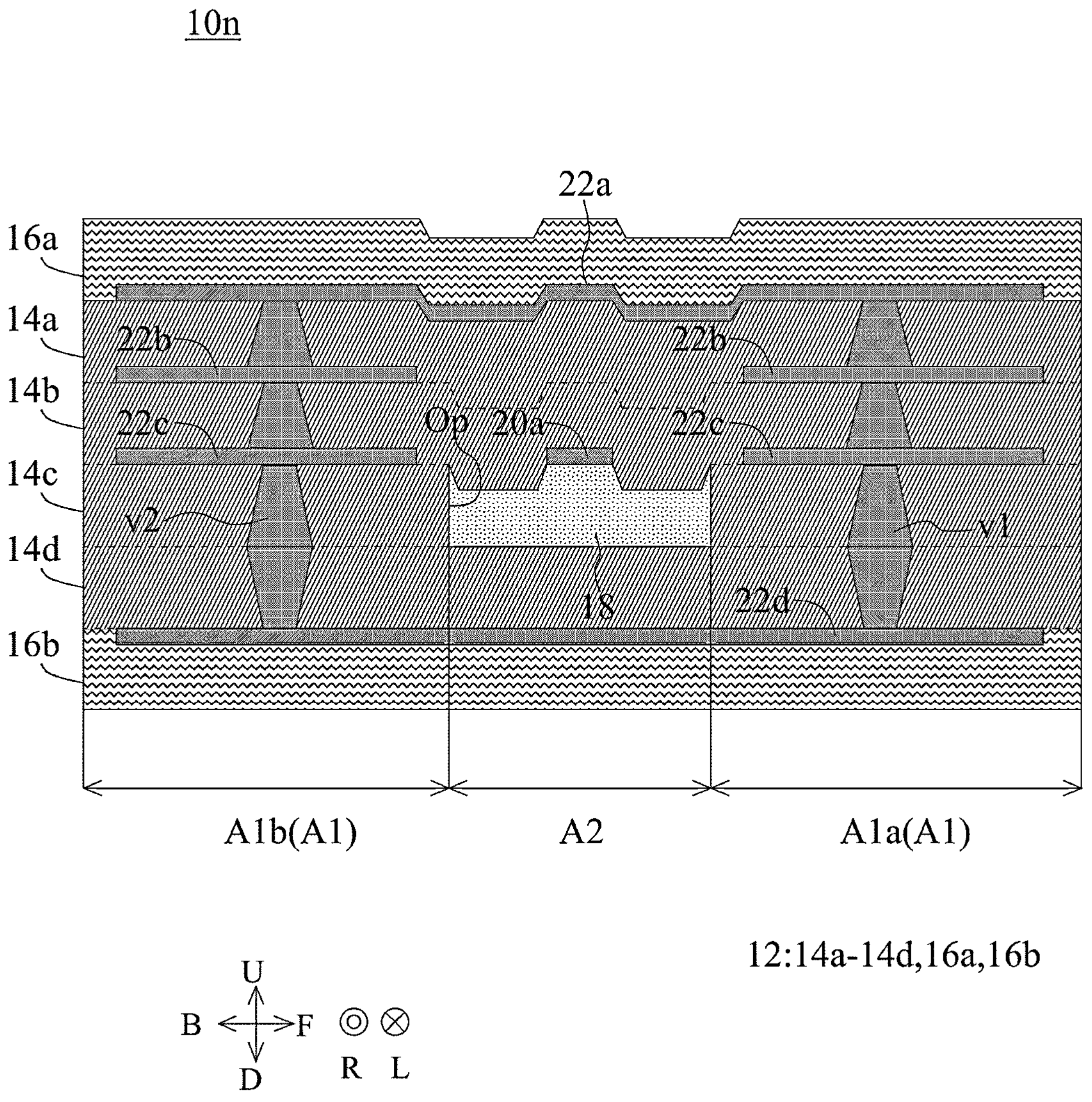
FIG. 25 is a cross-sectional view of a multilayer substrate 10*n*.

Hereinafter, a multilayer substrate **10*n* according to a fourteenth modification will be described with reference to the drawings. FIG. 25 is a cross-sectional view of the multilayer substrate 10*n***.

The multilayer substrate **10*n* differs from the multilayer substrate 10 in that two recesses are provided in the upper main surface of the second insulator layer 18. More specifically, the upper main surface of the second insulator layer 18 is dented downward in front of and behind the signal conductor layer 20*a*. As such, the second insulator layer 18 is prevented from being displaced in the front-back direction during stacking. Since the other structure of the multilayer substrate 10*n* is the same as that of the multilayer substrate 10, the description thereof is omitted. The multilayer substrate 10*m* has the same function and effect as the multilayer substrate 10**.

Fifteenth Modification

Figure 26:
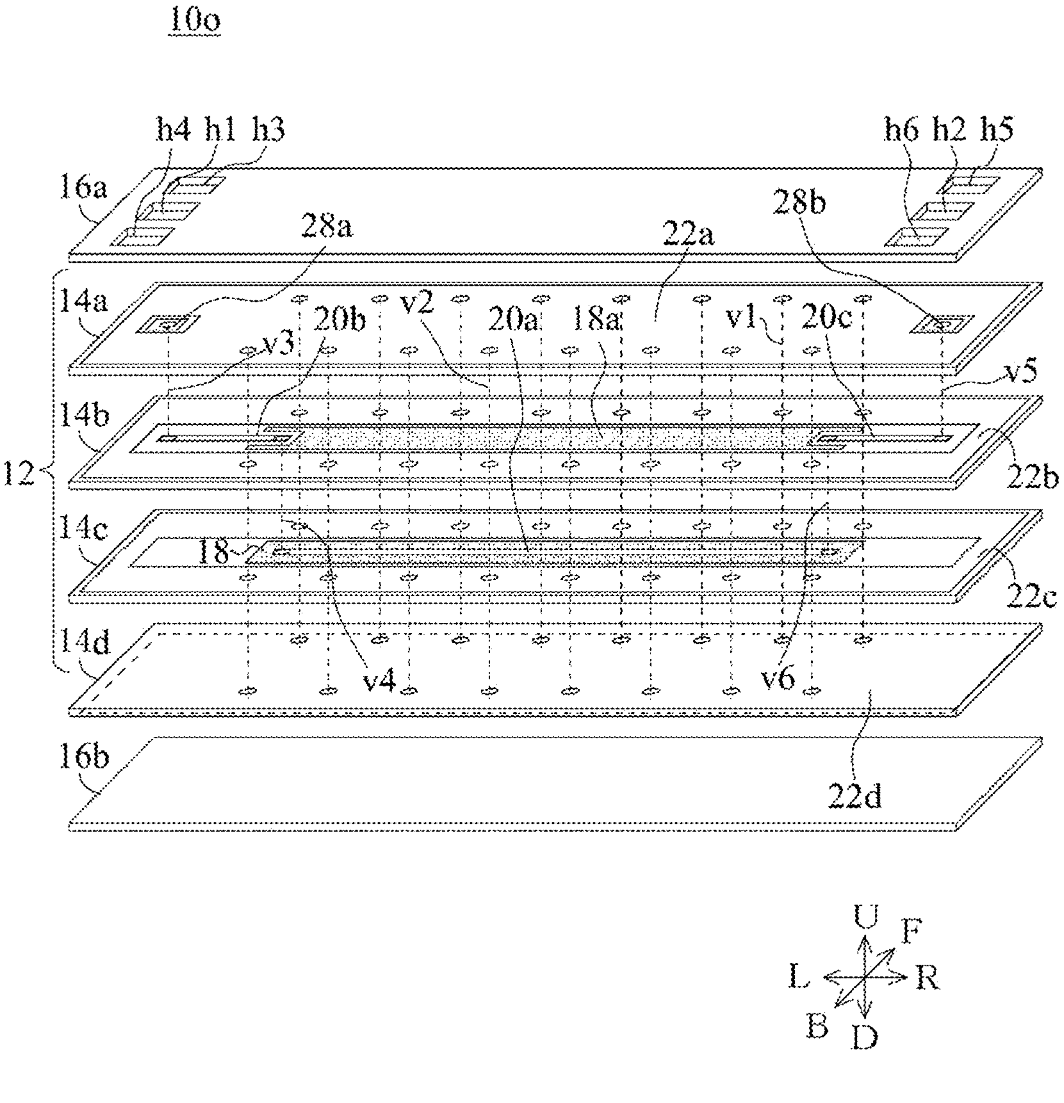
FIG. 26 is an exploded perspective view of a multilayer substrate 10*o*.
Figure 27:
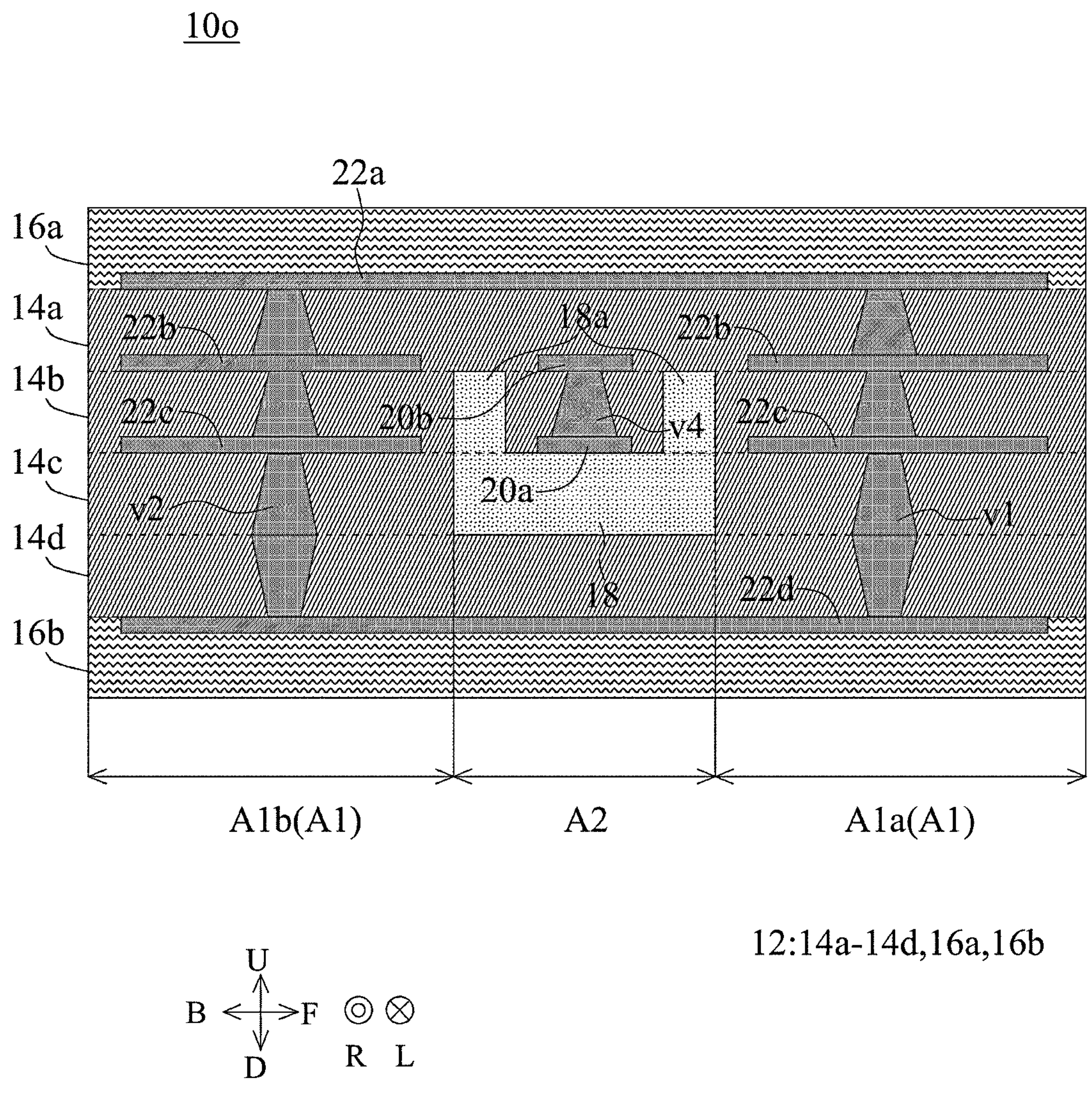
FIG. 27 is a cross-sectional view of the multilayer substrate 10*o*.

Hereinafter, a multilayer substrate **10*o* according to a fifteenth modification will be described with reference to the drawings. FIG. 26 is an exploded perspective view of the multilayer substrate 10*o*. FIG. 27 is a cross-sectional view of the multilayer substrate 10*o***.

The multilayer substrate **10*o* differs from the multilayer substrate 10*f* in that the second insulator layer 18*a* is located in front of and behind the left end portion of the signal conductor layer 20*a* and that the second insulator layer 18*a* is located in front of and behind the right end portion of the signal conductor layer 20*a*. However, the left end portion and the right end portion of the signal conductor layer 20*a* are not in contact with the second insulator layer 18*a*. Thus, the second insulator layer 18*a* is located in four directions, i.e., in front of, behind, below, and to the right of the interlayer connection conductor v4. The second insulator layer 18*a* is located in four directions, i.e., in front of, behind, below, and to the left of the interlayer connection conductor v6. Since the other structure of the multilayer substrate 10*o* is the same as that of the multilayer substrate 10*f*, description thereof is omitted. The multilayer substrate 10*o* has the same function and effect as the multilayer substrate 10*f***.

Note that the interlayer connection conductor v3 and the interlayer connection conductor v4 may be arranged in the up-down direction. The interlayer connection conductor v5 and the interlayer connection conductor v6 may be arranged in the up-down direction.

Note that the second insulator layer **18*a* may surround the interlayer connection conductors v4 and v6** when viewed in the up-down direction.

Other Modifications

Figure 28:
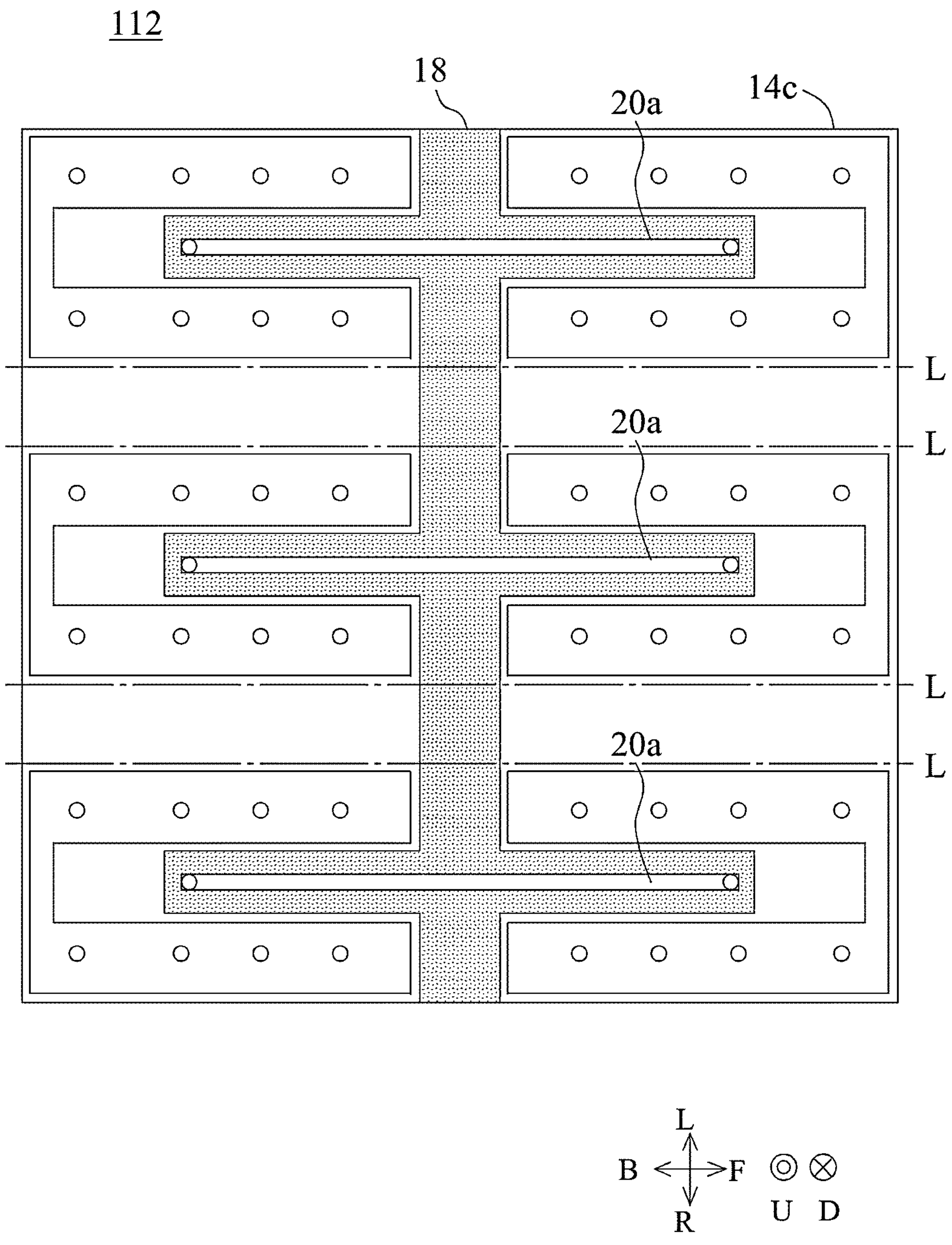
FIG. 28 is a top view of a mother multilayer body 112 of the multilayer substrate 10*h*.

A non-limiting example of a method for manufacturing the multilayer substrate **10*h* according to another modification will be described below with reference to the drawings. FIG. 28 is a top view of a mother multilayer body 112 of the multilayer substrate 10*h*. In FIG. 28, the mother multilayer body 112** is seen through.

As illustrated in FIG. 28, in the method for manufacturing the multilayer substrate **10*h*, the mother multilayer body 112 in which the plurality of multilayer bodies 12 is integrated is formed. The mother multilayer body 112 is cut along cut lines L illustrated in FIG. 28 to form the plurality of multilayer bodies 12. Here, in the state of the mother multilayer body 112, two second insulator layers 18** adjacent to each other are connected to each other in the front-back direction.

Figure 29:
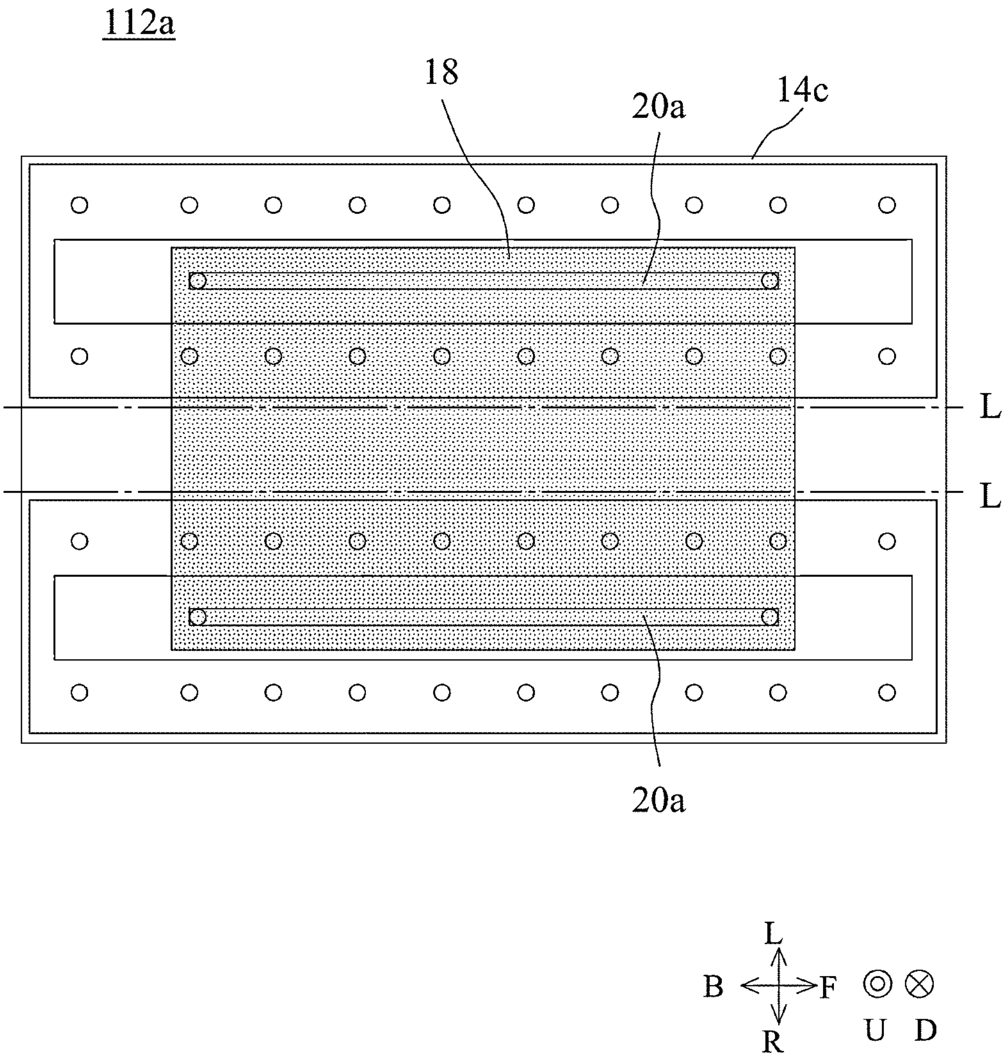
FIG. 29 is a top view of a mother multilayer body 112*a*.

Note that a mother multilayer body **112*a* may have a structure illustrated in FIG. 29. FIG. 29 is a top view of the mother multilayer body 112*a*. In FIG. 29, the mother multilayer body 112*a* is seen through. In the mother multilayer body 112*a*, the second insulator layer 18 has a rectangular shape. The two second insulator layers 18 adjacent to each other in the front-back direction may be connected to each other over the entire long sides of the two second insulator layers 18**.

Other Preferred Embodiments

Circuit boards according to preferred embodiments of the present invention and modifications thereof are not limited to the multilayer substrates 10 and 10*a* to 10*o*, and can be changed within the scope of the gist thereof. Note that the structures of the multilayer substrates 10 and 10*a* to 10*o* may be arbitrarily combined.

Note that the first insulator layers 14*a* to 14*d* may have two or more kinds of porosities. For example, the porosity of the first insulator layers 14*a* and 14*c* may be different from the porosity of the first insulator layers 14*b* and 14*d*.

Note that the material of the first insulator layers 14*a* to 14*d* need not be a thermoplastic resin. The first insulator layers 14*a* and 14*c* may be bonded by the first insulator layers 14*b* and 14*d* which are adhesive layers.

Note that in the multilayer substrates 10 and 10*a* to 10*o*, the signal conductor layers, the interlayer connection conductors, and the reference conductor layers are not essential elements.

Note that the entire signal conductor layers 20*a* to 20*c* may be located in the second region A2.

Note that the multilayer substrates 10 and 10*a* to 10*o* may include one or more interlayer connection conductors.

Note that the second region A2 need not be bent. The first region A1 may be bent.

Note that the small deformation regions A111 and A112 may be bent.

Note that the material of the second insulator layer may be resin other than the thermoplastic resin.

Note that an interlayer connection conductor may be provided in the second insulator layer.

Note that a side surface of the small-area first insulator layer and the side surface of the second insulator layer need not be in contact with each other. Accordingly, an adhesive or filler may be present between the side surface of the small-area first insulator layer and the side surface of the second insulator layer. The adhesive is located over or under the second insulator layer and the small-area first insulator layer, and flows into between the side surface of the small-area first insulator layer and the side surface of the second insulator layer when the multilayer body 12 is pressure-bonded. In this case, a distance between the side surface of the small-area first insulator layer and the side surface of the second insulator layer is, for example, equal to or less than the thickness of the second region A2 in the up-down direction. In addition, the filler is an insulating material filling a portion between the side surface of the small-area first insulator layer and the side surface of the second insulator layer so that no gap is formed between the side surface of the small-area first insulator layer and the side surface of the second insulator layer. The adhesive or the filler present between the side surface of the small-area first insulator layer and the side surface of the second insulator layer is located in the first region A1.

Note that the multilayer substrates 10 and 10*a* to 10*o* may be bent relative to a longitudinal direction of the multilayer substrates 10 and 10*a* to 10*o* when viewed in the up-down direction. "The multilayer substrates 10 and 10*a* to 10*o* are bent" means that the multilayer substrates 10 and 10*a* to 10*o* are bent in a state where an external force is not applied.

Note that at least one of the first insulator layers 14*a*, 14*b*, and 14*d*, which are the large-area first insulator layers, may be located in at least a portion of the first region A1 and the entire second region A2 when viewed in the up-down direction (stacking direction), and may be located at the boundary between the first region A1 and the second region A2 when viewed in the up-down direction (stacking direction).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:

a multilayer body including a plurality of first insulator layers and a second insulator layer stacked on each other; wherein a direction orthogonal to a stacking direction of the multilayer body is a first direction;

a direction orthogonal to the stacking direction and the first direction is a second direction;

the multilayer body includes a first region and a second region when viewed in the stacking direction;

the first region is a region that does not include the second insulator layer when viewed in the stacking direction;

the second region is a region that includes the second insulator layer when viewed in the stacking direction;

the plurality of first insulator layers includes a small-area first insulator layer;

the first region and the second region are adjacent to each other in the second direction when viewed in the stacking direction;

the small-area first insulator layer is located in the first region and is not located in the second region;

the small-area first insulator layer overlaps the second insulator layer when viewed in the first direction;

a porosity of the second insulator layer is higher than a porosity of the plurality of first insulator layers; and a thickness in the stacking direction of the second insulator layer is smaller than a thickness in the stacking direction of the small-area first insulator layer overlapping the second insulator layer when viewed in the first direction.

2. The multilayer substrate according to claim 1, wherein the plurality of first insulator layers further includes one or more large-area first insulator layers located in the first region and the second region.

3. The multilayer substrate according to claim 2, wherein at least one of the one or more large-area first insulator layers is located in at least a portion of the first region and the entire second region when viewed in the stacking direction, and is located at a boundary between the first region and the second region when viewed in the stacking direction.

4. The multilayer substrate according to claim 1, further comprising a first signal conductor layer in the multilayer body.

5. The multilayer substrate according to claim 4, wherein at least a portion of the first signal conductor layer is located in the second region.

6. The multilayer substrate according to claim 4, wherein the second insulator layer includes at least two second insulator layers; and the first signal conductor layer is located in the second region, and is sandwiched between the at least two second insulator layers in the first direction and the second direction when viewed in the stacking direction.

7. The multilayer substrate according to claim 4, wherein the first signal conductor layer is not located in the second region.

8. The multilayer substrate according to claim 7, further comprising one or more interlayer connection conductors in the multilayer body; wherein a thickness of the multilayer body in the stacking direction is larger than a shortest distance between the one or more interlayer connection conductors and the second insulator layer when viewed in the stacking direction.

9. The multilayer substrate according to claim 8, further comprising a second signal conductor layer provided in the multilayer body; wherein the second signal conductor layer is not located in the second region; and the second insulator layer is between the first signal conductor layer and the second signal conductor layer when viewed in the stacking direction.

10. The multilayer substrate according to claim 5, wherein an interlayer connection conductor is not located in the second insulator layer.

11. The multilayer substrate according to claim 1, wherein the second insulator layer includes one or more second insulator layers.

12. The multilayer substrate according to claim 1, wherein the second region is bent; and a radius of curvature of the second region is smaller than a radius of curvature of the first region.

13. The multilayer substrate according to claim 1, wherein the second region connects both ends of the multilayer body in the first direction when viewed in the stacking direction.

* * * * *